(12) United States Patent
Moura

(10) Patent No.: US 11,164,769 B2
(45) Date of Patent: Nov. 2, 2021

(54) ROBOT EMBEDDED VISION APPARATUS

(71) Applicant: BROOKS AUTOMATION, INC., Chelmsford, MA (US)

(72) Inventor: Jairo Terra Moura, Marlborough, MA (US)

(73) Assignee: Brooks Automation, Inc., Chelmsford, MA (US)

(\*) Notice: Subject to any disclaimer, the term of this patent is extended or adjusted under 35 U.S.C. 154(b) by 0 days.

(21) Appl. No.: 16/942,255

(22) Filed: Jul. 29, 2020

(65) Prior Publication Data
US 2021/0043484 A1   Feb. 11, 2021

Related U.S. Application Data

(60) Provisional application No. 62/880,521, filed on Jul. 30, 2019.

(51) Int. Cl.
*B25J 13/08* (2006.01)
*H01L 21/67* (2006.01)
(Continued)

(52) U.S. Cl.
CPC ...... *H01L 21/67259* (2013.01); *B25J 9/1612* (2013.01); *B25J 9/1692* (2013.01);
(Continued)

(58) Field of Classification Search
CPC ......... H01L 21/68707; H01L 21/67259; H01L 21/67184; H01L 21/67742; H01L 21/681;
(Continued)

(56) References Cited

U.S. PATENT DOCUMENTS 6,471,464 B1   10/2002   Fay et al.
6,630,995 B1   10/2003   Hunter
(Continued)

OTHER PUBLICATIONS

Fatikow et al., Microrobot system for automatic nanohandling inside a scanning electron microscope, 2006, IEEE, p. 1402-1407 (Year: 2006).*
(Continued)

*Primary Examiner* — McDieunel Marc
(74) *Attorney, Agent, or Firm* — Perman & Green, LLP; Colin C. Durham

(57) ABSTRACT

A substrate transport apparatus includes a transport chamber, a drive section, a robot arm, an imaging system with a camera mounted through a mounting interface of the drive section in a predetermined location with respect to the transport chamber and disposed to image part of the arm, and a controller connected to the imaging system and configured to image, with the camera, the arm moving to or in the predetermined location, the controller effecting capture of a first image of the arm on registry of the arm proximate to or in the predetermined location, the controller is configured to calculate a positional variance of the arm from comparison of the first image with a calibration image of the arm, and determine a motion compensation factor changing an extended position of the arm. Each camera effecting capture of the first image is disposed inside the perimeter of the mounting interface.

28 Claims, 23 Drawing Sheets

(51) Int. Cl.
*H01L 21/687* (2006.01)
*B25J 9/16* (2006.01)
*G06T 7/73* (2017.01)
*H04N 5/225* (2006.01)
*G06K 9/00* (2006.01)
*G06K 9/62* (2006.01)

(52) U.S. Cl.
CPC .......... *B25J 9/1697* (2013.01); *B25J 13/08* (2013.01); *G06K 9/00664* (2013.01); *G06K 9/6201* (2013.01); *G06T 7/73* (2017.01); *H01L 21/68707* (2013.01); *H04N 5/2253* (2013.01)

(58) Field of Classification Search
CPC ........ B25J 11/0095; B25J 18/04; B25J 9/126; B25J 18/00; B25J 19/0054; B25J 13/08; B25J 9/1612; B25J 9/1692; B25J 9/1697; Y10T 74/20305; G05B 19/4189; G06K 9/00664; G06K 9/6201; G06K 2209/19; G06T 7/73; G06T 2207/30148; G06T 7/001; G06T 7/74; B41J 11/0095; B41J 25/308; B41J 2/04505; B41J 2/04586; B41J 2/2135
See application file for complete search history.

(56) References Cited

U.S. PATENT DOCUMENTS

| | | | |
|---|---|---|---|
| 6,845,292 B2 | 1/2005 | Sha et al. | |
| 7,039,501 B2 | 5/2006 | Freeman et al. | |
| 7,129,694 B2 | 10/2006 | Brunner et al. | |
| 7,813,832 B2 | 10/2010 | Sundar | |
| 9,548,231 B2 | 1/2017 | Hosek et al. | |
| 9,842,757 B2 | 12/2017 | Hosek et al. | |
| 10,792,822 B2 * | 10/2020 | Hosek | H01L 21/67259 |
| 2001/0052392 A1 | 12/2001 | Nakamura et al. | |
| 2002/0089655 A1 | 7/2002 | Kida et al. | |
| 2003/0198376 A1 * | 10/2003 | Sadighi | H01L 21/67259 382/153 |
| 2003/0202092 A1 * | 10/2003 | Sadighi | B25J 9/1697 348/87 |
| 2007/0009345 A1 * | 1/2007 | Hall | B65G 47/34 414/222.01 |
| 2009/0062960 A1 | 3/2009 | Krishnasamy et al. | |
| 2013/0014605 A1 * | 1/2013 | Caveney | B25J 18/04 74/490.03 |
| 2016/0126128 A1 * | 5/2016 | Bonora | H01L 21/6715 414/222.02 |
| 2016/0136806 A1 * | 5/2016 | Caveney | B25J 9/126 74/490.03 |
| 2017/0018446 A1 * | 1/2017 | Yin | H01L 21/68707 |
| 2018/0104830 A1 * | 4/2018 | Hosek | H01L 21/67259 |
| 2018/0286728 A1 | 10/2018 | Moura et al. | |
| 2019/0027389 A1 | 1/2019 | Moura et al. | |
| 2019/0164800 A1 * | 5/2019 | Yin | H01L 21/68707 |

OTHER PUBLICATIONS

Reddy et al., Integration of robotic arm with vision system, 2014, IEEE, p. 1-5 (Year: 2014).*
Wilson et al., Pheeno, A Versatile Swarm Robotic Research and Education Platform, 2016, IEEE, p. 884-891 (Year: 2016).*
Lebrón et al., A novel near-field robotic scanner for surface, RF and thermal characterization of millimeter-wave active phased array antenna, 2016, IEEE, pg. (Year: 2016).*

* cited by examiner

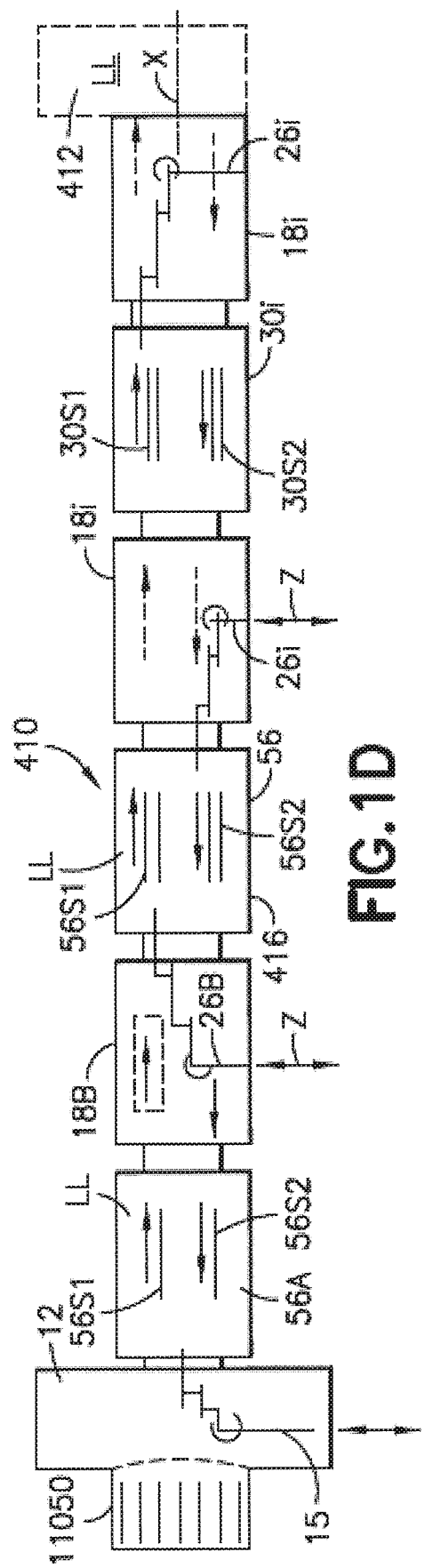

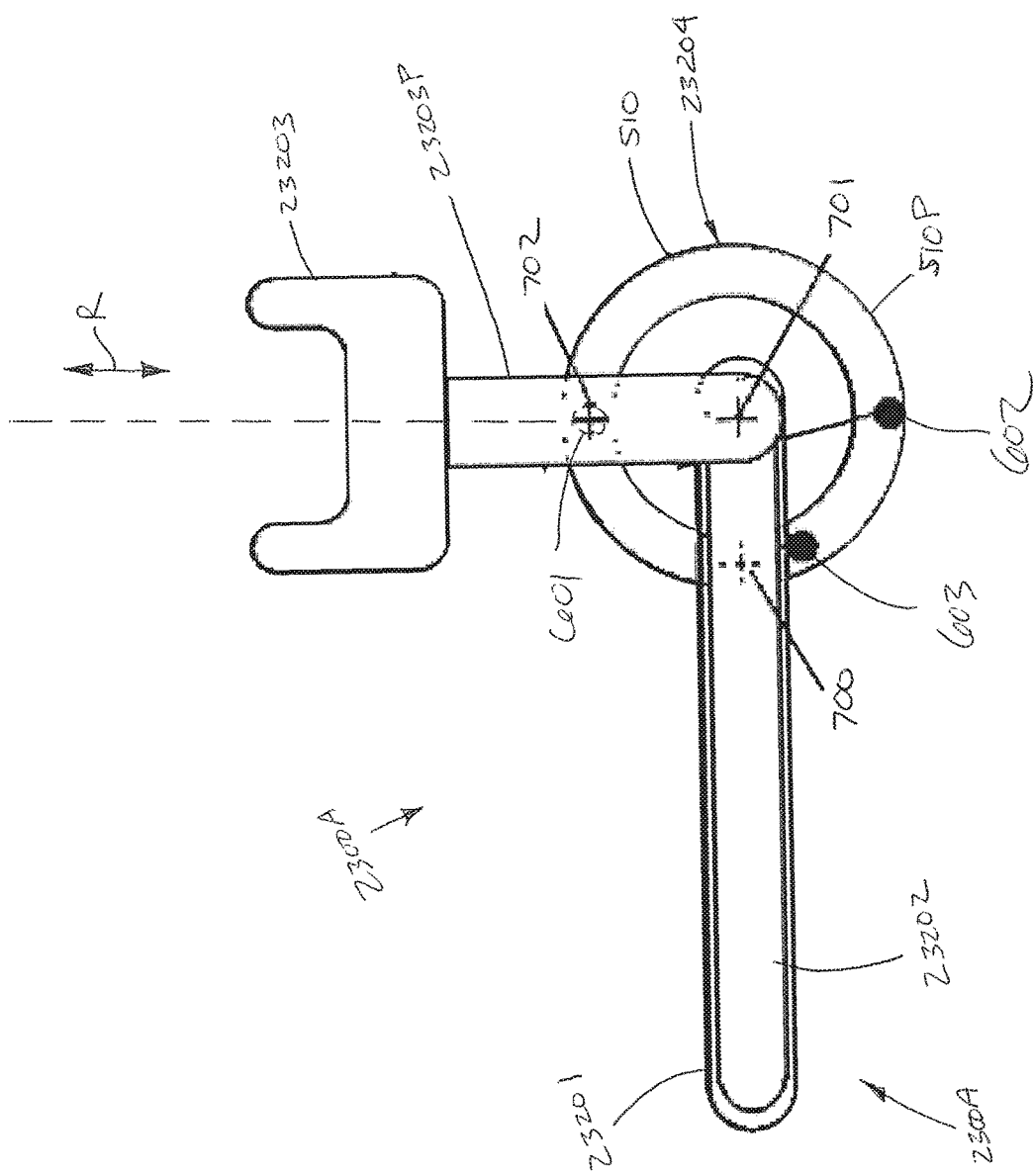

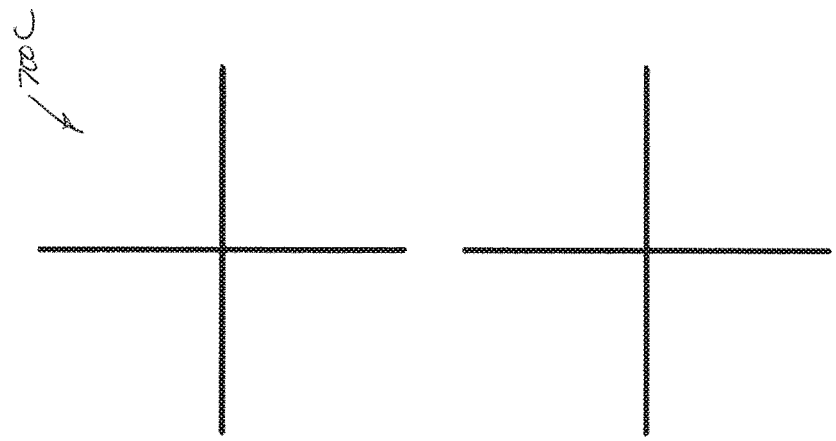
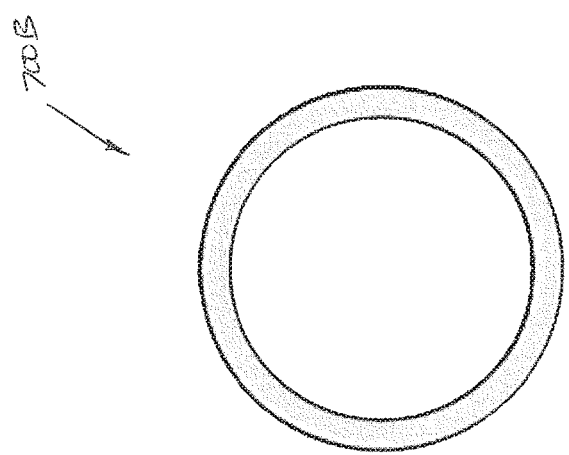
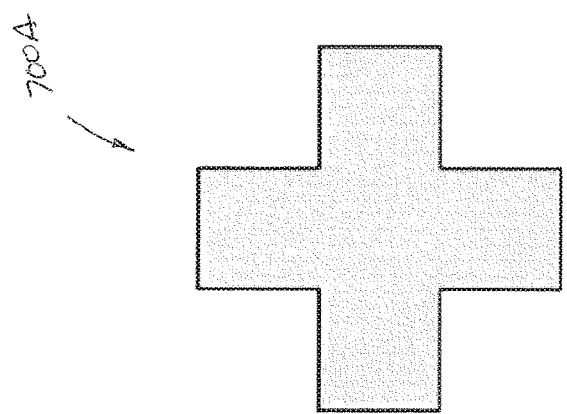
FIG. 8B

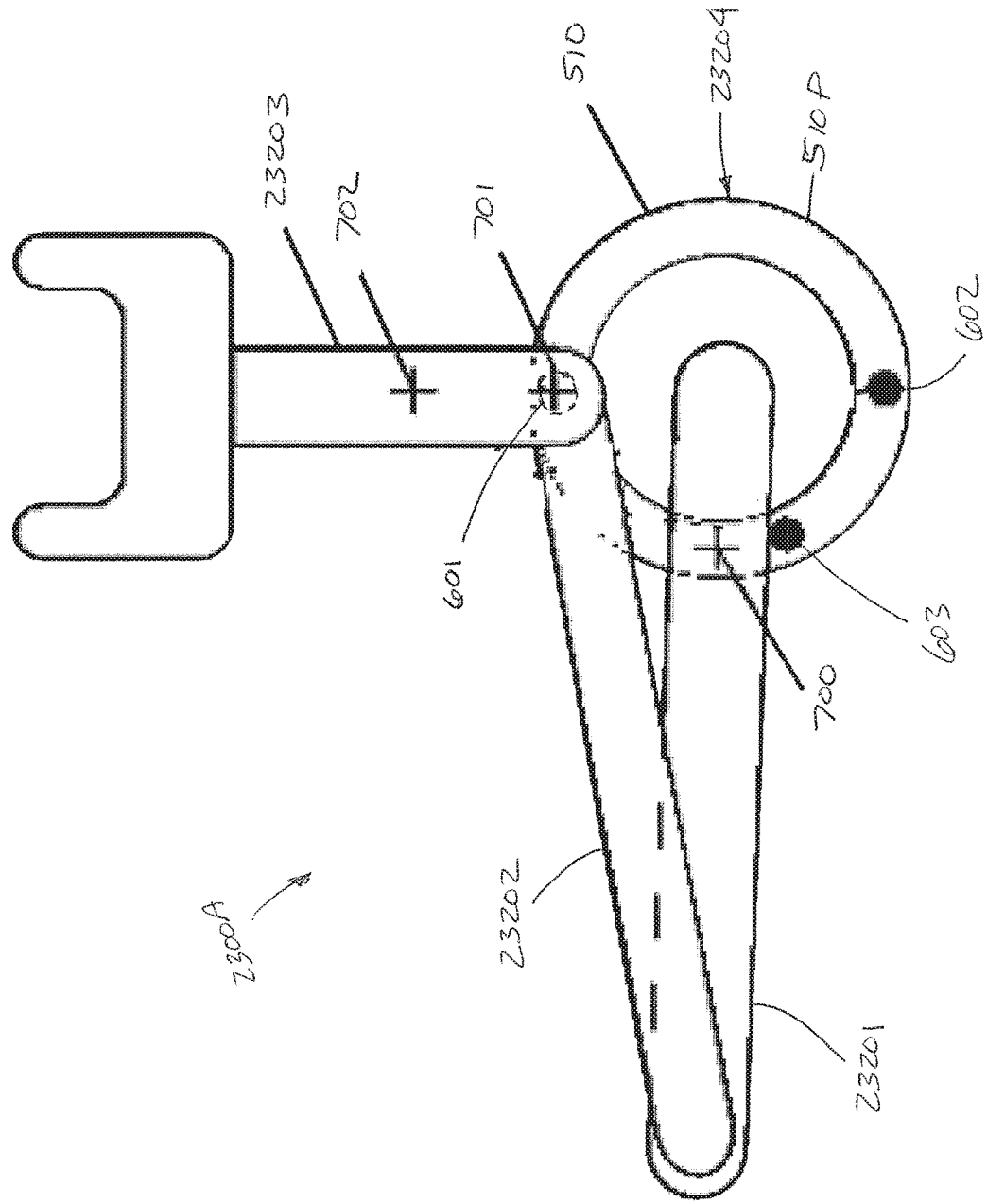

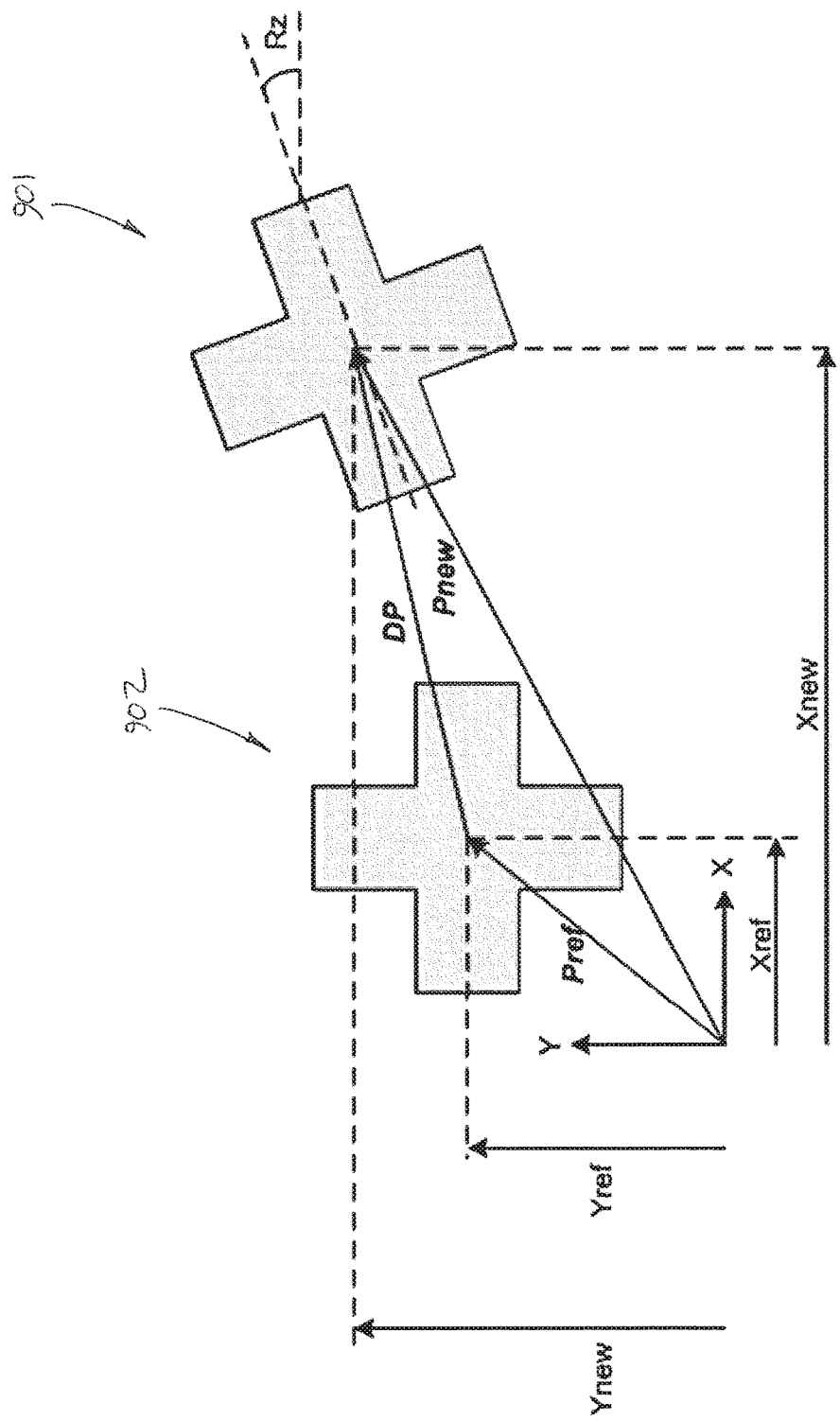

ROBOT EMBEDDED VISION APPARATUS

CROSS-REFERENCE TO RELATED APPLICATIONS

This application is a non-provisional of and claims the benefit of U.S. provisional patent No. 62/880,521 filed on Jul. 30, 2019, the disclosure of which is incorporated herein in its entirety.

BACKGROUND

1. Field

The exemplary embodiments generally relate to substrate processing apparatus, and more particularly, to substrate transport apparatus.

2. Brief Description of Related Developments

Generally semiconductor automation operate in vacuum environments with unknown and high temperature variations imposed by the various process module stations, such as coupled to or forming a cluster tool. Conventional semiconductor automation designs, such as robot designs, rely on embedded position feedback devices located away from the position where the substrate is being handled in space. For example, analog or digital rotary or linear encoders are utilized to detect the position of the motor actuators and this information is used to calculate the expected position of the robot end-effector in space via an assumed kinematic model of the manipulator. Due to high dimensional variability in the robot arm links imposed by the environment that the robot arm operates (such as thermal effects), the actual location of the links and end-effector may not be known.

Generally, different solutions for substrate handling accuracy have been proposed. As an example, vision systems have been used at the process module stations to be able to provide additional position feedback loops. Other types of robot position sensing, such as GPS based, have also been proposed as a way not only to locate the robot in space but also to find the respective process module stations. Other approaches utilize reflective or through beam laser sensors located in the vicinity of gate valves of the process module stations to correct for wafer/substrate offsets relative to the end-effector. These solutions may be referred to as Active Wafer Centering (AWC) with thermal compensation. Some versions of AWC also compensate for robot arm links dimensional variability due to thermal effects such as by tracking features of the end effector or wrist of the robot arm using AWC sensors, such as disposed at the process module stations or gate valves, as the arm dimensions thermally changes.

The conventional solutions for substrate handling accuracy noted above may be deficient in that undesirable changes (e.g., due to cost, downtime, etc.) to, for example, the cluster tool (or other processing equipment configuration) are required to support additional position or temperature feedback information. Sensing technology may not work well in the proximity of aggressive environments such as high temperatures or corrosive gases. Sensing technology may not provide enough information to properly predict thermal growth (or contraction).

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of a substrate processing apparatus incorporating aspects of the present disclosure;

FIG. 8A is a schematic illustration of a substrate transport of a substrate processing apparatus in accordance with aspects of the present disclosure;

FIG. 8B is a schematic illustration of exemplary targets of a substrate transport in accordance with aspects of the present disclosure;

FIG. 8C is a schematic illustration of a substrate transport of a substrate processing apparatus in accordance with aspects of the present disclosure;

FIG. 9 is a schematic illustration of target position transformation due to thermal effects in accordance with aspects of the present disclosure;

DETAILED DESCRIPTION

Figure 1A:
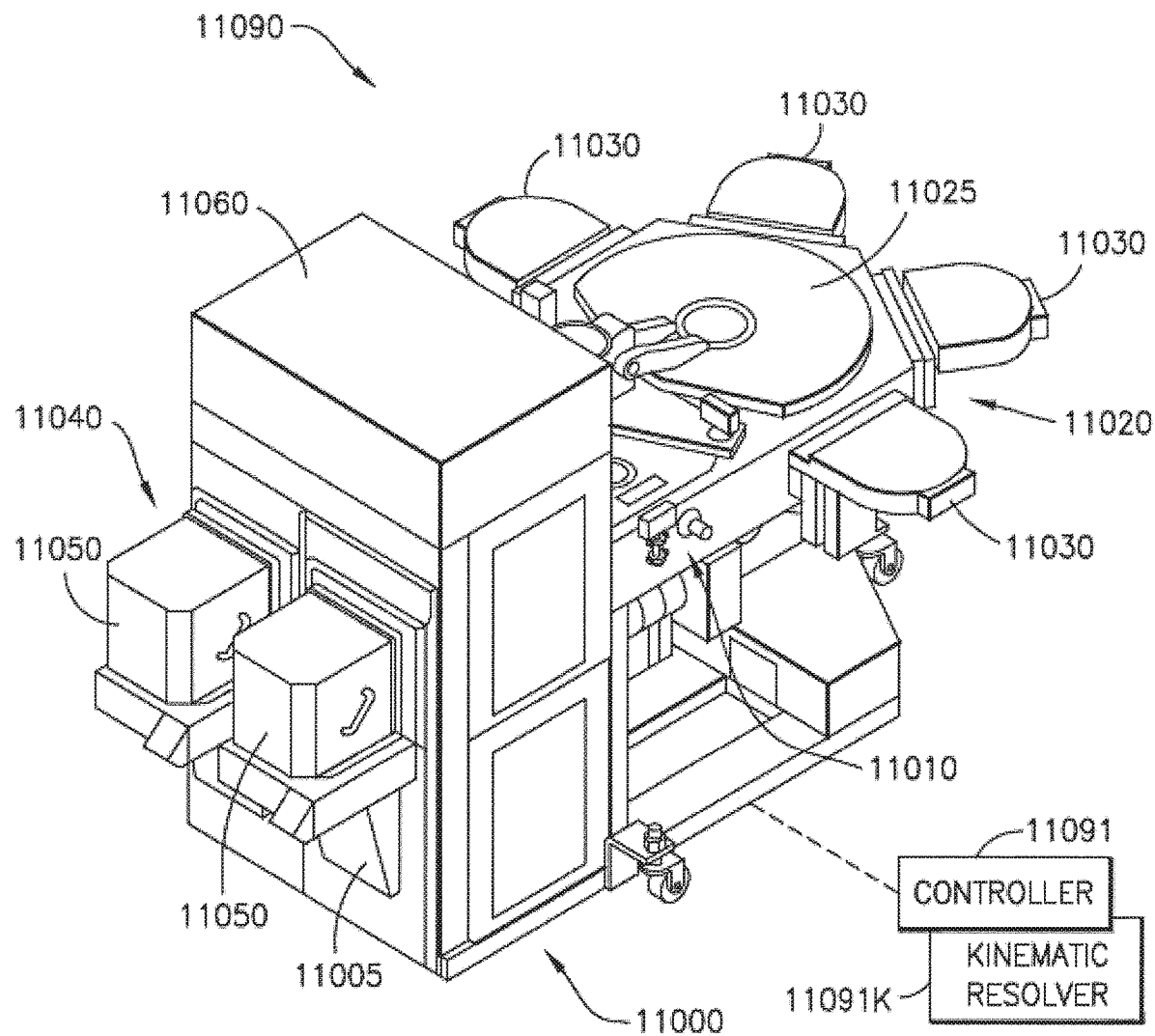

FIGS. 1A-1D illustrates exemplary schematic views of substrate processing apparatus in accordance with aspects of the present disclosure. Although the aspects of the present disclosure will be described with reference to the drawings, it should be understood that the aspects of the present disclosure can be embodied in many forms. In addition, any suitable size, shape or type of elements or materials could be used.

The concept of high accuracy substrate handling stems from the idea of being able to place substrates at desired locations within minimum position variability despite of environmental changes. As will be described in greater detail below, the aspects of the present disclosure provide for an apparatus(es) and method(s) to improve substrate transport placement accuracy within enclosed or sealed environments such as the enclosed or sealed environments found in the substrate processing apparatus of FIGS. 1A-1D or any other suitable substrate processing equipment/chamber. The aspects of the present disclosure provide for a self-contained solution that employs vision (and/or other non-contact) based sensing systems without the need to make modifications to the substrate processing apparatus and chambers thereof. The aspects of the present disclosure provide high accuracy feedback and thermal compensation of substrate transport apparatus position (e.g., a position of a manipulator or end effector) in space without changes or modifications to a structure of substrate processing apparatus, without adding electronics to the vacuum environment, and with minimum or no impact to the substrate transport apparatus arm and/or manipulator mechanical design.

In accordance with the aspects of the present disclosure a substrate transport apparatus vision based sensor system is provided/located on an atmospheric side of the processing system (e.g., outside of a vacuum chamber/environment in which an arm of the substrate transport apparatus operates) to measure the location of at least one point or target on the arm of the substrate transport apparatus with links of the arm in one or more arm link positions in space. One exemplary position of the arm links is a bot top center pose (or fully retracted position/orientation of the arm) or any other suitable predetermined pose of the arm. The bot top center pose (or other predetermined arm pose) is calibrated or set at manufacture of the arm (e.g., such as at a home or zeroed position of the motor encoders).

The vision based sensor system images the at least one point or target on the arm at a baseline temperature of the transfer chamber to establish a reference location and temperature (e.g., baseline measurements). The arm kinematics can be updated with new measurements as the arm operates and the temperature within the transfer chamber changes relative to the baseline measurements in order to provide accurate adjustments for the robot kinematic model running within a controller of the substrate transport apparatus. The vision based sensor system provided by the present disclosure does not interfere with the arm of the substrate transport apparatus or a customer's semiconductor manufacturing process.

Figure 1B:
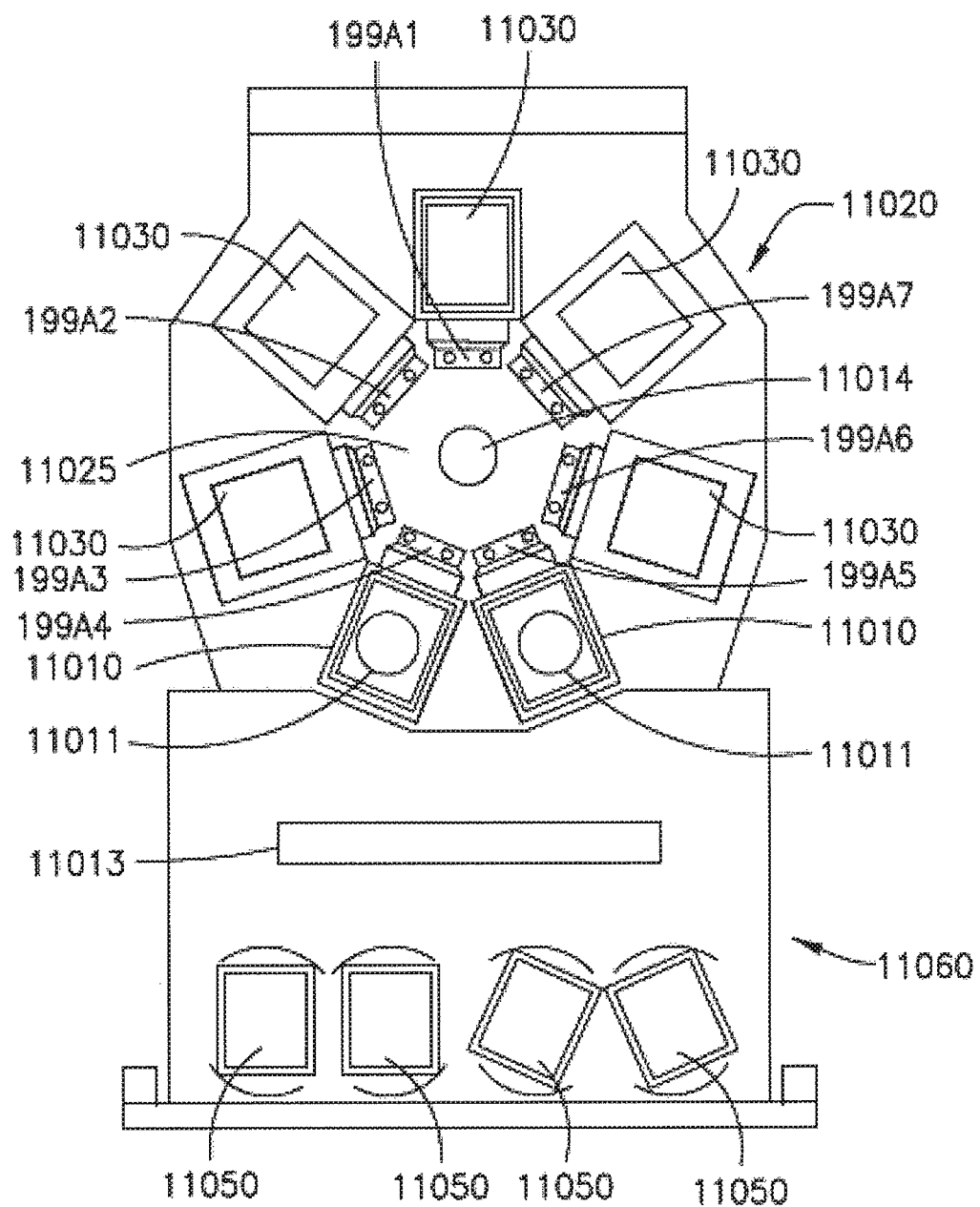

Referring to FIGS. 1A and 1B, a processing apparatus, such as for example a semiconductor tool station 11090 is shown in accordance with aspects of the disclosed embodiment. Although a semiconductor tool 11090 is shown in the drawings, the aspects of the disclosed embodiment described herein can be applied to any tool station or application employing robotic manipulators. In this example the tool 11090 is shown as a cluster tool, however the aspects of the disclosed embodiment may be applied to any suitable tool station such as, for example, a linear tool station such as that shown in FIGS. 1C and 1D and described in U.S. Pat. No. 8,398,355, entitled "Linearly Distributed Semiconductor Workpiece Processing Tool," issued Mar. 19, 2013, the disclosure of which is incorporated by reference herein in its entirety. The tool station 11090 generally includes an atmospheric front end 11000, a vacuum load lock 11010 and a vacuum back end 11020. In other aspects, the tool station may have any suitable configuration. The components of each of the front end 11000, load lock 11010 and back end 11020 may be connected to a controller 11091 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized. The controller 11091 includes any suitable memory and processor(s) that include non-transitory program code for operating the processing apparatus described herein to effect the automatic substrate centering and/or automatic location of substrate holding stations of a substrate processing apparatus and teaching a substrate transport apparatus the locations of the substrate holding stations as described herein. For example, in one aspect, the controller 11091 includes embedded substrate locating commands (e.g. for determining an eccentricity between the substrate and end effector of the substrate transport apparatus). In one aspect the substrate locating commands may be embedded pick/place commands that move the substrate, and the end effector on which the substrate is held, past or through one or more automatic substrate centering sensors. The controller is configured to determine the center of the substrate and a reference position of the end effector and determine an eccentricity of the substrate relative to the reference position of the end effector. In one aspect, the controller is configured to receive detection signals corresponding to one or more features of the end effector and/or transport arm of a substrate transport apparatus/robot and determine a thermal expansion or contraction of the substrate transport apparatus or a component of the substrate transport apparatus due to, for example a temperature within the processing module.

As may be realized, and as described herein, in one aspect, the substrate station is located inside, and the auto-teaching described herein occurs in, a process module having a vacuum pressure environment therein. In one aspect the vacuum pressure is a high vacuum such as $10^{-5}$ Torr or below. In one aspect, the auto-centering and/or teaching described herein occurs within a substrate station feature located for example within a process module that is in a state of process security (e.g. for processing substrates). The state of process security for processing substrates is a condition of the process module wherein the process module is sealed in a cleanliness state ready for introducing process vacuum or atmosphere into the process module, or a state ready for introducing a production wafer into the process module.

In one aspect, the front end 11000 generally includes load port modules 11005 and a mini-environment 11060 such as for example an equipment front end module (EFEM). The load port modules 11005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer or 450 mm wafer interfaces or any other suitable substrate interfaces such as for example larger or smaller wafers or flat panels for flat panel displays. Although two load port modules 11005 are shown in FIG. 1A, in other aspects any suitable number of load port modules may be incorporated into the front end 11000. The load port modules 11005 may be configured to receive substrate carriers or cassettes 11050 from an overhead transport system, automatic guided vehicles, person guided vehicles, rail guided vehicles or from any other suitable transport method. The load port modules 11005 may interface with the mini-environment 11060 through load ports 11040. In one aspect the load ports 11040 allow the passage of substrates between the substrate cassettes 11050 and the mini-environment 11060.

In one aspect, the mini-environment 11060 generally includes any suitable transfer robot 11013 that incorporates one or more aspects of the disclosed embodiment described herein. In one aspect the robot 11013 may be a track mounted robot such as that described in, for example, U.S. Pat. No. 6,002,840, the disclosure of which is incorporated by reference herein in its entirety or in other aspects, any other suitable transport robot having any suitable configuration. The mini-environment 11060 may provide a controlled, clean zone for substrate transfer between multiple load port modules.

The vacuum load lock 11010 may be located between and connected to the mini-environment 11060 and the back end 11020. It is again noted that the term vacuum as used herein may denote a high vacuum such as $10^{-5}$ Torr or below in which the substrates are processed. The load lock 11010 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. In one aspect, the load lock 11010 includes an aligner 11011 for aligning a fiducial of the substrate to a desired position for processing. In other aspects, the vacuum load lock may be located in any suitable location of the processing apparatus and have any suitable configuration and/or metrology equipment.

The vacuum back end 11020 generally includes a transport chamber 11025, one or more processing station(s) or module(s) 11030 and any suitable transfer robot or apparatus 11014. The transfer robot 11014 will be described below and may be located within the transport chamber 11025 to transport substrates between the load lock 11010 and the various processing stations 11030. The processing stations 11030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 11030 are connected to the transport chamber 11025 to allow substrates to be passed from the transport chamber 11025 to the processing stations 11030 and vice versa. In one aspect the load port modules 11005 and load ports 11040 are substantially directly coupled to the vacuum back end 11020 so that a cassette 11050 mounted on the load port interfaces substantially directly (e.g. in one aspect at least the mini-environment 11060 is omitted while in other aspects the vacuum load lock 11010 is also omitted such that the cassette 11050 is pumped down to vacuum in a manner similar to that of the vacuum load lock 11010) with a vacuum environment of the transfer chamber 11025 and/or a processing vacuum of a processing station 11030 (e.g. the processing vacuum and/or vacuum environment extends between and is common between the processing station 11030 and the cassette 11050).

Figure 1C:
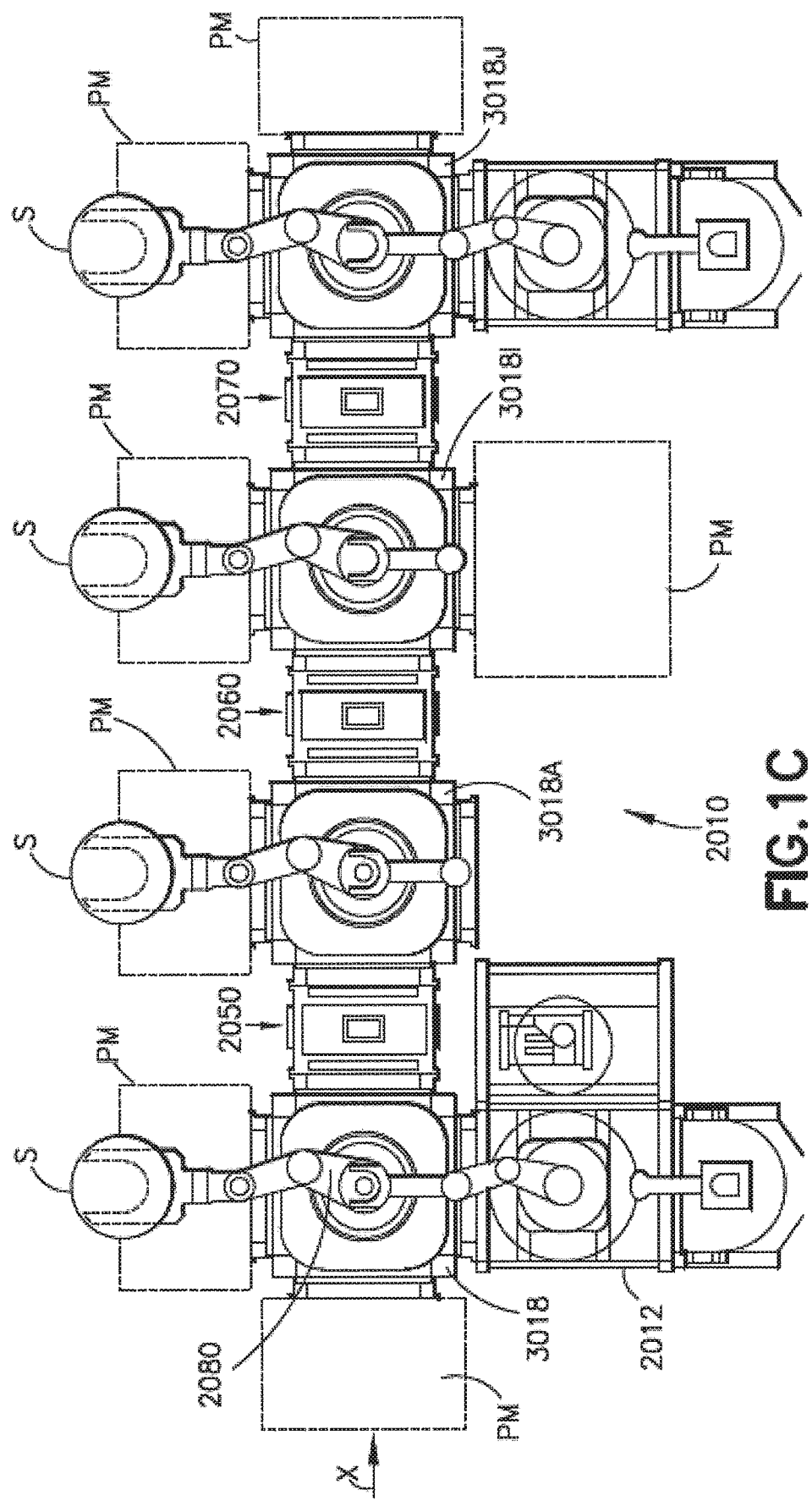

Referring now to FIG. 1C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3019A, 3018I, 3018J includes any suitable substrate transport 2080, which may include one or more aspects of the disclosed embodiment described herein, for transporting substrates throughout the processing system 2010 and into and out of, for example, processing modules PM (which in one aspect are substantially similar to processing stations 11030 described above). As may be realized, each chamber module may be capable of holding an isolated or controlled atmosphere (e.g. N2, clean air, vacuum).

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56 and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock.

Figure 2A:
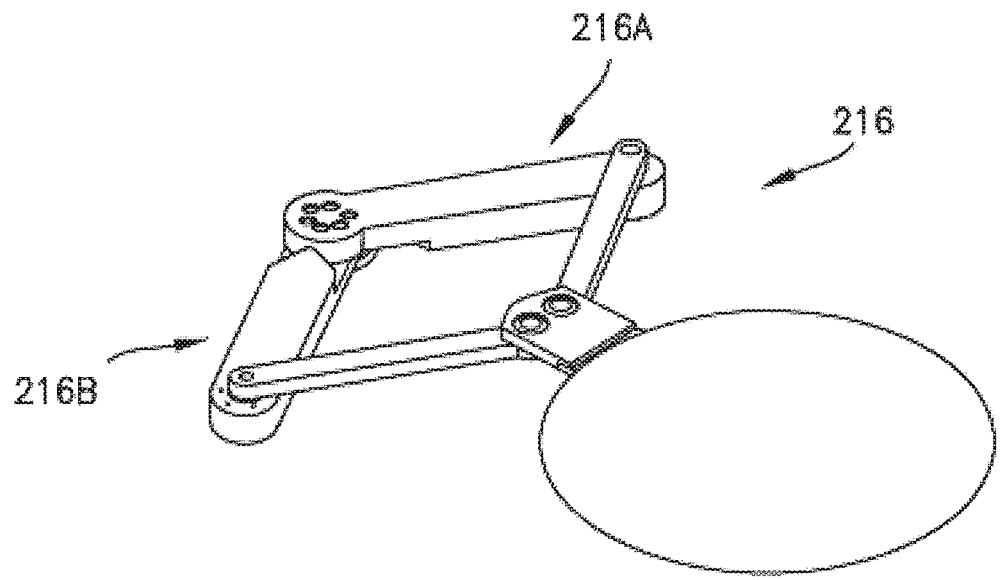
FIGS. 2A-2E are schematic illustrations of transport arms in accordance with aspects of the present disclosure.
Figure 2B:
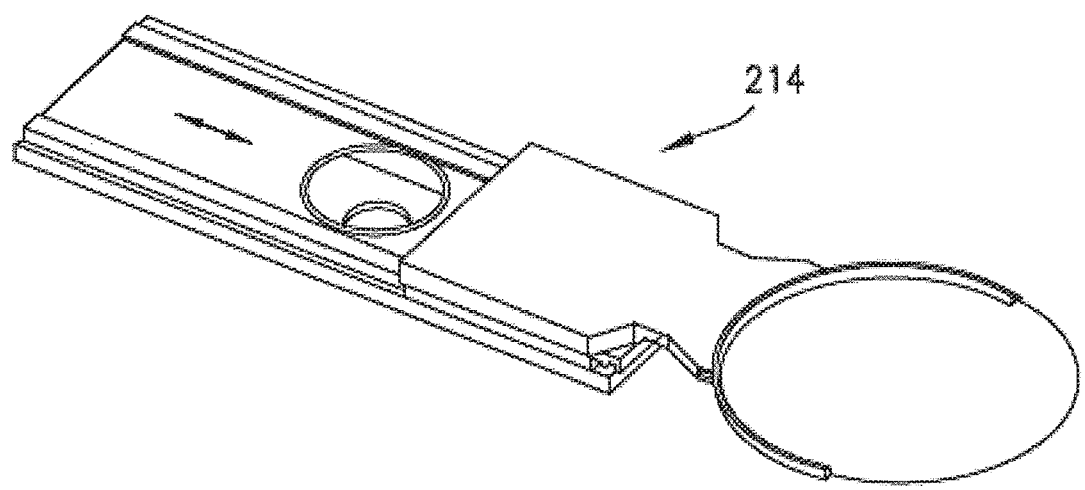

As also noted before, transport chamber modules 18B, 18i have one or more corresponding transport apparatus 26B, 26i, which may include one or more aspects of the disclosed embodiment described herein, located therein. The transport apparatus 26B, 26i of the respective transport chamber modules 18B, 18i may cooperate to provide the linearly distributed workpiece transport system in the transport chamber. In this aspect, the transport apparatus 26B (which may be substantially similar to the transport apparatus 11013, 11014 of the cluster tool illustrated in FIGS. 1A and 1B) may have a general SCARA arm configuration (though in other aspects the transport arms may have any other desired arrangement such as, for example, a linearly sliding arm 214 as shown in FIG. 2B or other suitable arms having any suitable arm linkage mechanisms. Suitable examples of arm linkage mechanisms can be found in, for example, U.S.

Figure 2C:
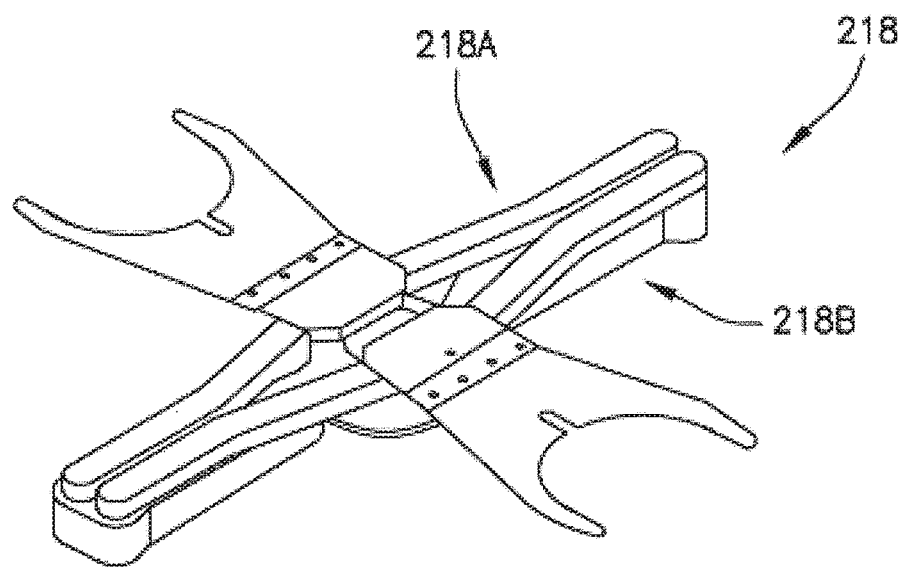
Figure 2D:
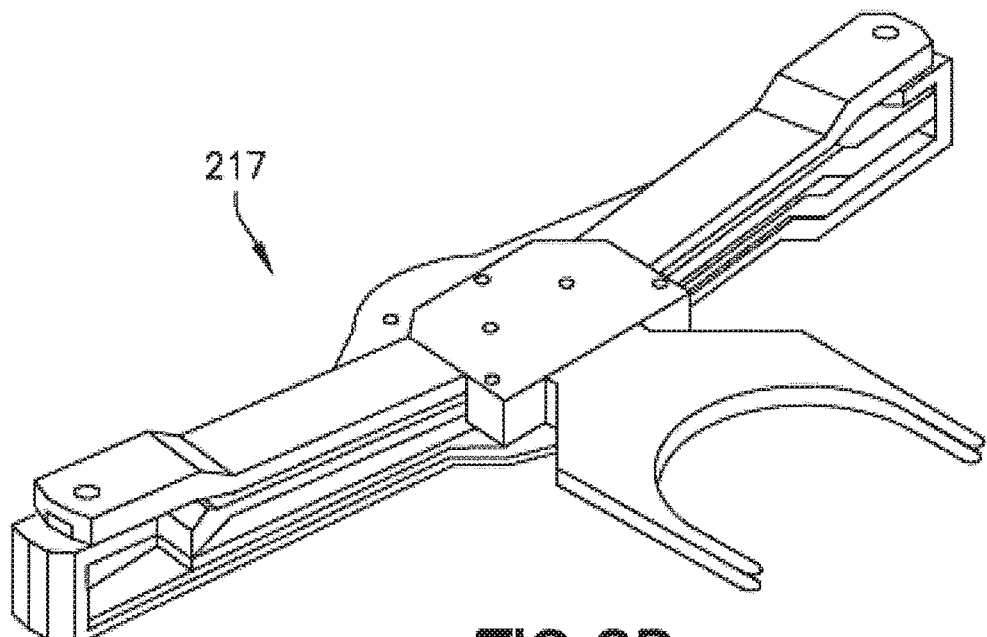
Figure 2E:
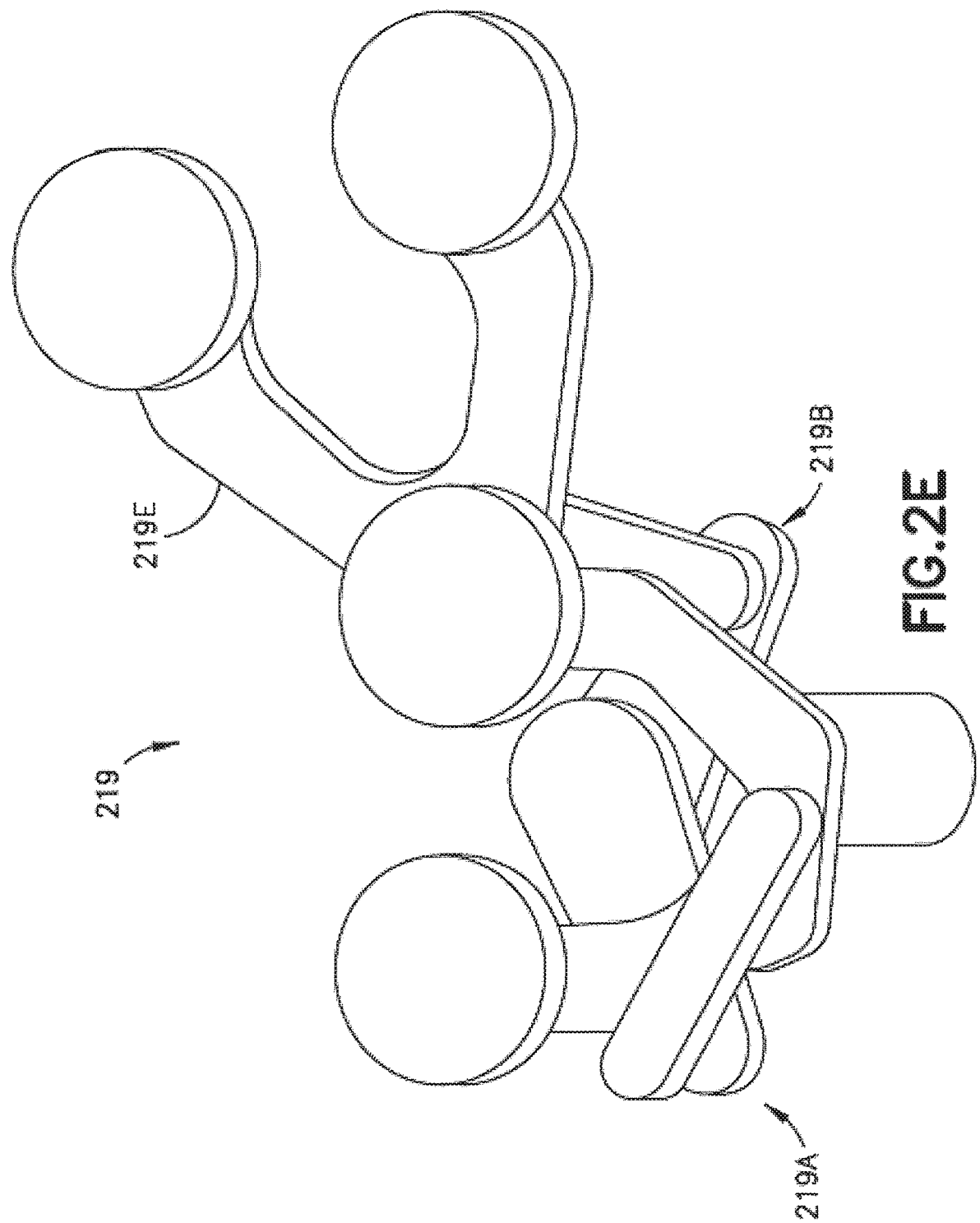

Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transfer arm may be derived from a conventional SCARA (selective compliant articulated robot arm) type design, which includes an upper arm, a band-driven forearm and a band-constrained end-effector, or from a telescoping arm or any other suitable arm design. Suitable examples of transfer arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 216 (FIG. 2A) configuration, a leap frog arm 217 (FIG. 2D) configuration, a bi-symmetric arm 218 (FIG. 2C) configuration, etc. In another aspect, referring to FIG. 2E, the transfer arm 219 includes at least a first and second articulated arm 219A, 219B where each arm 219A, 219B includes an end effector 219E configured to hold at least two substrates S1, S2 side by side in a common transfer plane (each substrate holding location of the end effector 219E shares a common drive for picking and placing the substrates S1, S2) where the spacing DX between the substrates S1, S2 corresponds to a fixed spacing between side by side substrate holding locations. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties. The aspects of the disclosed embodiment are, in one aspect, incorporated into the transport arm of a linear transport shuttle such as those described in, for example, U.S. Pat. Nos. 8,293,066 and 7,988,398 the disclosures of which are incorporated herein by reference in their entireties.

In the aspect of the disclosed embodiment shown in FIG. 1D, the arms of the transport apparatus 26B may be arranged to provide what may be referred to as fast swap arrangement allowing the transport to quickly swap wafers (e.g. pick a wafer from a substrate holding location and then immediately place a wafer to the same substrate holding location) from a pick/place location. The transport arm 26B may have any suitable drive section (e.g. coaxially arranged drive shafts, side by side drive shafts, horizontally adjacent motors, vertically stacked motors, etc.), for providing each arm with any suitable number of degrees of freedom (e.g. independent rotation about shoulder and elbow joints with Z axis motion). As seen in FIG. 1D, in this aspect the modules 56A, 56, 30*i* may be located interstitially between transfer chamber modules 18B, 18*i* and may define suitable processing modules, load lock(s) LL, buffer station(s), metrology station(s) or any other desired station(s). For example the interstitial modules, such as load locks 56A, 56 and workpiece station 30*i*, may each have stationary workpiece supports/shelves 56S1, 56S2, 30S1, 30S2 that may cooperate with the transport arms to effect transport or workpieces through the length of the transport chamber along linear axis X of the transport chamber. By way of example, workpiece (s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30*i* with arm 26*i* (in module 18*i*) and between station 30*i* and station 412 with arm 26*i* in module 18*i*. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18*i*. In such aspects, transport arms of adjoining transport chamber modules may pass off workpieces directly from end effector or one transport arm to end effector of another transport arm to move the workpiece through the transport chamber. The processing station modules may operate on the substrates through various deposition, etching, or other types of processes to form electrical circuitry or other desired structure on the substrates. The processing station modules are connected to the transport chamber modules to allow substrates to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Figure 3:
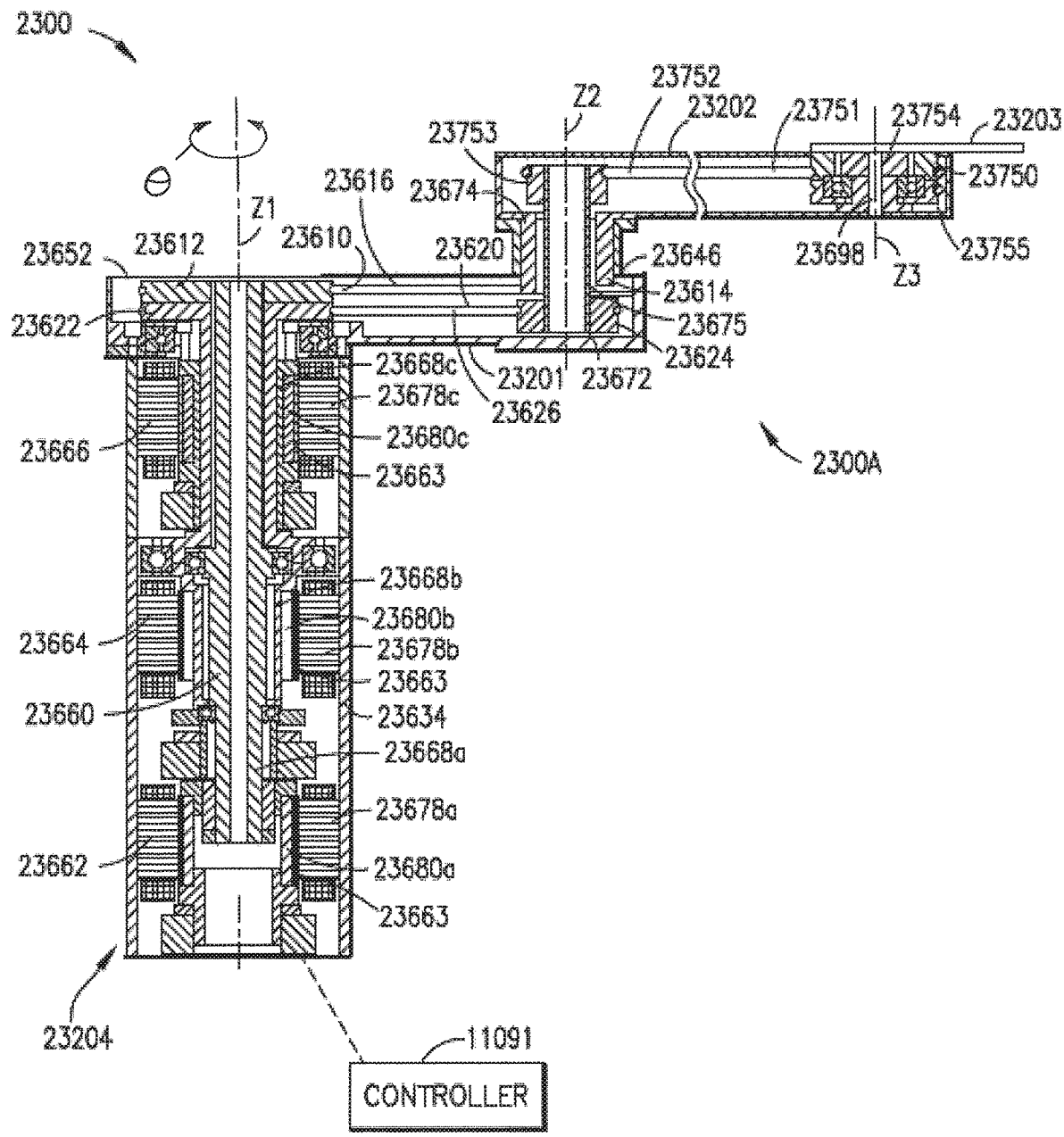
FIG. 3 is a schematic illustration of a portion of a substrate processing apparatus in accordance with aspects of the present disclosure.

Referring to FIG. 3, the substrate transport apparatus 2300 (such as those described above) will be described as having at least one multi-link or SCARA arm 2300A however, this aspects of the present disclosure are equally applicable to any suitable transport arm, such as those described above and including but not limited to Leap Frog arm configurations, Bi-symmetric arm configurations and articulated wrist configurations. Generally the transport apparatus 2300 includes the SCARA arm 2300A (generally referred to as arm 2300A) which has an upper arm 23201, a forearm 23202, a substrate holder or end effector 23203 (having a substrate holding station thereon), and drive section 23204. A controller 11091 may be connected to the transport apparatus 2300 to move the arm sections of the SCARA arm 2300A as desired. In other aspects, the arm assembly may have any other desired general SCARA configuration. For example, the assembly may have multiple forearms and/or multiple substrate holders.

The substrate holder 23203 is rotatably connected to the forearm 23202 by shaft assembly 23754 at a wrist 23755 of the transport apparatus 2300. Substrate holder 23203 may be rotatably connected by support shaft 23698 to the forearm 23202. In one aspect, the substrate holder 23203 may be a forked end effector. The substrate holder 23203 may have active mechanical or passive edge gripping. In other aspects, the substrate holder 23202 may be a paddle end effector with a vacuum chuck. The forearm 23202 is rotatably connected by a coaxial shaft assembly 23675 to the upper arm 23201 at elbow 23646 of the transport apparatus 2300. The substrate holder 23203 has a predetermined center where the end effector is configured to hold a substrate so that the center of the substrate is coincident with the predetermined center of the end effector for transporting the substrate within a substrate processing apparatus such as those described herein. The upper arm 23201 is rotatably connected at the shoulder 23652 to drive section 23204. In this aspect the upper arm 23201 and the forearm 23202 have equal lengths but in other aspects, the upper arm 23201, for example, may be shorter in length than forearm 23202 or vice versa.

In the aspect shown, drive section 23204 may have an outer housing 23634H which houses a coaxial shaft assembly 23660, and three motors 23662, 23664, 23666 or drive axes, each having a respective encoder 570, 571, 572 for determining a rotational position of, for example, a respective stator 23678a-23678c (and respective drive shaft 23668a-23668c coupled to the stator). In other aspects, the drive section could have more or fewer than three motors. The drive shaft assembly 23660 has three drive shafts 23668a, 23668b, 23668c. In other aspects, more or fewer than three drive shafts could be provided. The first motor 23662 comprises a stator 23678a and a rotor 23680a connected to the inner shaft 23668a. The second motor 23662 comprises a stator 23678b and a rotor 23680b connected to the middle shaft 23668b. The third motor 23666 comprises a stator 23678c and a rotor 23680c connected to the outer shaft 23668c. The three stators 23678a, 23678b, 23678c are stationarily attached to the housing 23634H at different vertical heights or locations along the housing. In this aspect the first stator 23678a is the bottom stator, the second stator 23678b is the middle stator and the third stator 23678c is the top stator. Each stator generally comprises an electromagnetic coil. The three shafts 23668a, 23668b, and 23668c are arranged as coaxial shafts. The three rotors 23680a, 23680b, 23680c are preferably comprised of permanent magnets, but may alternatively comprise a magnetic induction rotor which does not have permanent magnets. Sleeves 23663 are located between the rotor 23680 and the stators 23678 to allow the transport apparatus 2300 to be useable in a vacuum environment with the drive shaft assembly 23660 being located in a vacuum environment and the stators 23678 being located outside of the vacuum environment. However, the sleeves 23663 need not be provided if the transport apparatus 2300 is only intended for use in an atmospheric environment.

The first shaft 23668a is the inner shaft and extends from the bottom stator 23678a. The inner shaft has the first rotor 23680a aligned with the bottom stator 23678a. The middle shaft 23668b extends upward from the middle stator 23678b. The middle shaft has the second rotor 23680b aligned with the second stator 23678b. The outer shaft 23668c extends upward from the top stator 23678c. The outer shaft has the third rotor 23680c aligned with the upper stator 23678c. Various bearings are provided about the shafts 23668 and the housing 23634H to allow each shaft to be independently rotatable relative to each other and the housing 23634H. Each shaft 23668 may be provided with a suitable position sensor (e.g., such as the respective encoder 570-572) to signal the controller 11091 of the rotational position of the shafts 23668 relative to each other and/or relative to the housing 23634H. Any suitable sensor could be used, such as an optical or induction sensor.

The outer shaft 23668c is fixedly connected to the upper arm 23201 so that shaft 23668c and upper arm 23201 rotate together as a unit about axis Z1. The middle shaft 23668b is connected to a first transmission 23620 in the upper arm 23201 and the inner shaft 23668a is connected to a second transmission 23610 in the upper arm 23201 as shown in FIG. 23. The first transmission 23620 preferably comprises a drive pulley 23622, an idler pulley 23624 and drive cables or belts 23626. The drive pulley 23622 is fixedly mounted to the top of the middle shaft 23668b and is connected by drive belt 23626 to the idler pulley 23624. The idler pulley 23624 is fixedly mounted to the bottom of the inner shaft 23672 of coaxial shaft assembly 23675 connecting the forearm 23202 to the upper arm 23201. The second transmission 23610 in the upper arm 23201 preferably comprises a drive pulley 23612, an idler pulley 23614 and drive belts or cables 23616. Drive pulley 23612 is fixedly mounted to the top of the inner shaft 23668a of coaxial shaft assembly 23660 in drive section 23204. The idler pulley 23614 is fixedly mounted to the bottom of the outer shaft 23674 of the coaxial shaft assembly connecting the forearm 23202 to the upper arm 23201. Drive belt 23616 connects the drive pulley 23612 to the idler pulley 23614. The diameter ratio (e.g. pulley ratio) between the idler and drive pulleys 23624, 23622 of the first transmission 23626 and between the idler and drive pulleys 23614, 23612 of the second transmission 23610 may be any suitable drive ratio such as those described herein. The drive belts 23616, 23626 are configured to rotate the respective idler pulleys 23614, 23624 in the same direction as the corresponding drive pulley 23612, 23622 (e.g. clockwise rotation of drive pulleys 23612, 23622 causes clockwise rotation of idler pulleys 23614, 23624).

The coaxial shaft assembly 23675 connecting the forearm 23202 to the upper arm 23201 is rotatably supported from the upper arm 23201 by suitable bearings which allow the outer and inner shafts 23674, 23672 of the shaft assembly to rotate about axis Z2 relative to each other and to the upper arm 23201. The outer shaft 23674 of coaxial shaft assembly 23675 is fixedly mounted to the forearm 23202 so that the shaft 23674 and forearm 23202 rotate together as a unit about Z2. The forearm 23202 is rotated about axis Z2 when the idler pulley 23614 of the second transmission 23610 in the upper arm 23201 is rotated by inner shaft 23668a of drive section 23204. Thus, the inner shaft 23668a of drive section 23204 is used to independently rotate forearm 23202 relative to the upper arm 23201.

The inner shaft 23672 of the coaxial shaft assembly is fixedly attached to drive pulley 23753 of a third transmission 23752 in the forearm 23202. The third transmission 23752 in the forearm 23202 preferably comprises drive pulley 23753, an idler pulley 23750 and drive belts or cables 23751. Idler pulley 23750 is fixedly mounted to shaft 23698. Drive belt 23751 connects the drive pulley 23753 to idler pulley 23750. Shaft 23698 is rotatably supported from the forearm 23202 by suitable bearings which allow the shaft 23698 to rotate about axis Z3 relative to the forearm 23202. The diameter ratio between the idler and drive pulleys 23750, 23753 of the third transmission 23752 in this aspect is any suitable drive ratio such as those described herein. The drive belts 23751 are configured to rotate the idler pulley 23750 in the same direction as the drive pulley 23753 (e.g. clockwise rotation of drive pulley 23753 causes clockwise rotation of idler pulley 23750).

Shaft 23698 is fixedly mounted to the substrate holder 23203. Thus, the shaft 23698 and substrate holder 23203 rotate together as a unit about axis Z3. The substrate holder 23203 is rotated about axis Z3 when idler pulley 23750 of the third transmission 23752 is rotated by drive pulley 23753. Drive pulley 23753 in turn is rotated by inner shaft 23672 of the coaxial shaft assembly 23675. Inner shaft 23672 is rotated when idler pulley 23624 of the first transmission 23626 in the upper arm 23201 is rotated by middle shaft 23268b of drive section 23204. Hence, the substrate holder 23203 may be independently rotated with respect to forearm 23202 and upper arm 23201 about axis Z3.

Figure 4:
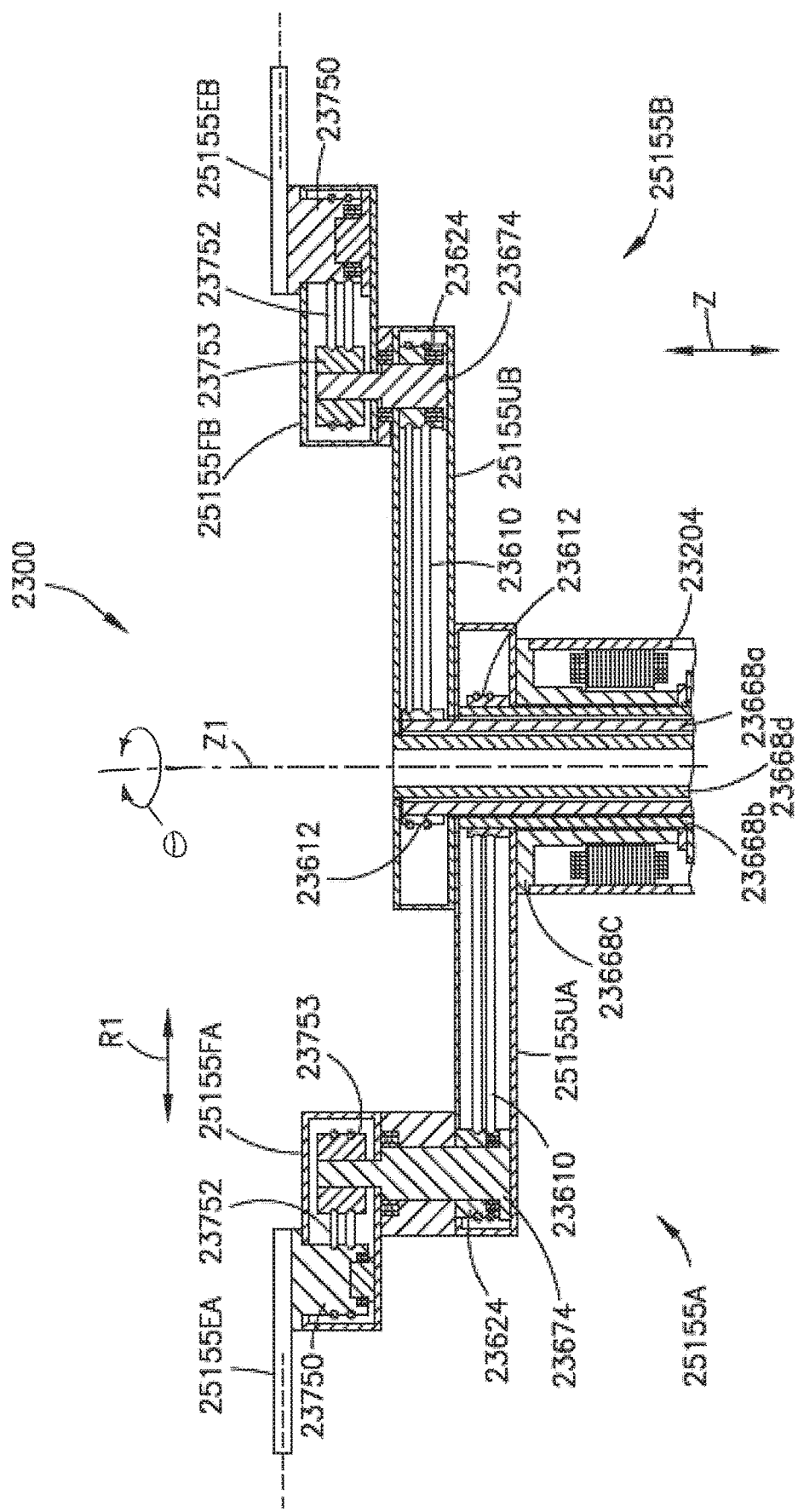
FIG. 4 is a schematic illustration of a portion of a substrate processing apparatus in accordance with aspects of the present disclosure.

Referring to FIG. 4, in one aspect, the transport apparatus 2300 may include two SCARA arms 25155A, 25155B that are substantially similar to arm 2300A. For example, each SCARA arm 25155A, 25155B includes an upper arm link 25155UA, 25155UB, a forearm link 25155FA, 25155FB and an end effector 25155EA, 25155EB. In this aspect the end effectors 25155EA, 25155EB are slaved to the upper arm but in other aspects, the end effectors may be independently driven. The arms 25155A, 25155B, are shown as three link SCARA arms, and may be coupled co-axially to the drive section 23204, and may be vertically stacked on top of each other to allow for independent theta motion (using e.g. a four axis drive—see drive shaft 23668d) or coupled theta motion (using e.g. a three axis drive) where the coupled theta motion is rotation of the robot arms as a unit about the shoulder axis Z1 substantially without extension or retraction. Each arm 25155A, 25155B is driven by a pair of motors and may have any suitable drive pulley arrangement. In one aspect the diameter ratio between the shoulder pulley, elbow pulley and wrist pulley for each arm may be, for non-limiting exemplary purposes, a 1:1:2 ratio or a 2:1:2 ratio. To extend each arm using, e.g. the 1:1:2 ratio each motor in the pair of motors is rotated in substantially equal and opposite directions. To extend each arm using, e.g., the 2:1:2 ratio the shoulder pulley is held substantially fixed (e.g. substantially does not rotate) and the motor coupled to the upper arm is rotated to extend the arm. Theta motion is controlled by rotating the motors in the same direction substantially at the same speed. Where the end effectors are on the same plane the theta motion of each of the arms relative to each other is limited, however the arms can move infinitely in theta if the arms are moved together. As may be realized, where the end effectors are not on the same plane each arm can move infinitely in theta when each arm is driven independent of the other arm such as when using the four axis drive.

Figure 5:
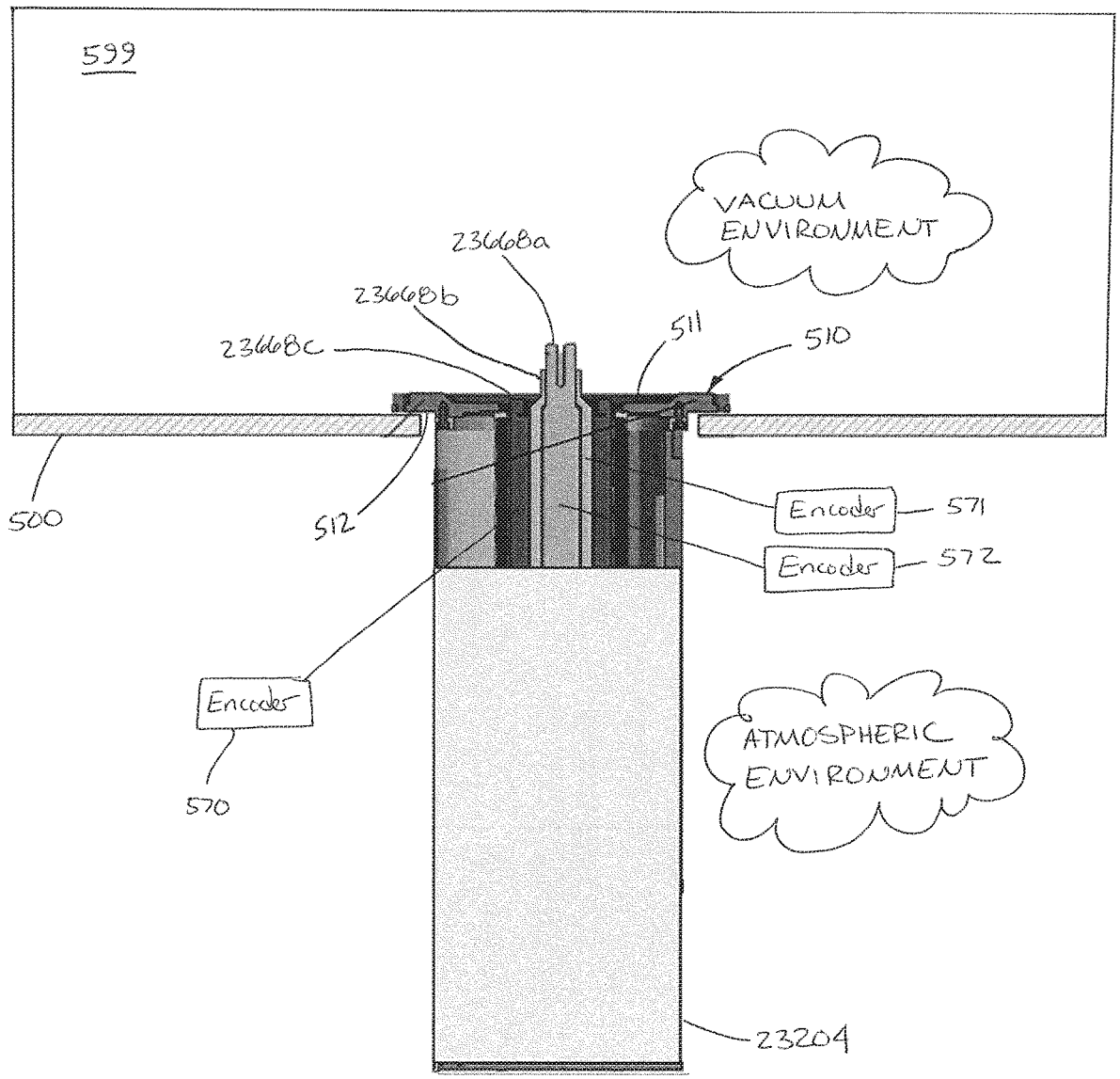
FIG. 5 is a schematic illustration of a portion of a substrate processing apparatus in accordance with aspects of the present disclosure.

Referring to FIG. 5, the drive section 23204 is shown coupled to a vacuum chamber wall 500 of a vacuum chamber 599 (such as of any suitable transport chamber of the substrate processing apparatus described herein). It is noted that while a vacuum chamber is described, the chamber 599 may have any suitable processing environment therein. Here, the drive section 23204 includes a mounting interface 510 that sealingly couples with vacuum chamber wall 500 so as to form an isolation barrier that substantially isolates (or seals) the vacuum environment within the vacuum chamber 599 from an atmospheric environment surrounding an exterior of the vacuum chamber 599. For example, the mounting interface 510 mounts the drive section 23204 to the vacuum chamber 599 and forms a perimeter that separates an interior of the vacuum chamber 599 on an outside of the perimeter from an exterior of the vacuum chamber 599 on the inside of the perimeter 510P. It is noted that extension and retraction of the robot arm 2300A is with respect to the shoulder axis Z1 located inside perimeter 510P, Here, at least a portion of the drive section 23204 is disposed within the atmospheric environment. The mounting interface 510 is configured so that a portion 511 of the mounting interface 510 is exposed to the vacuum environment and another portion 512 of the mounting interface 510 is disposed to the atmospheric environment.

Figure 6:
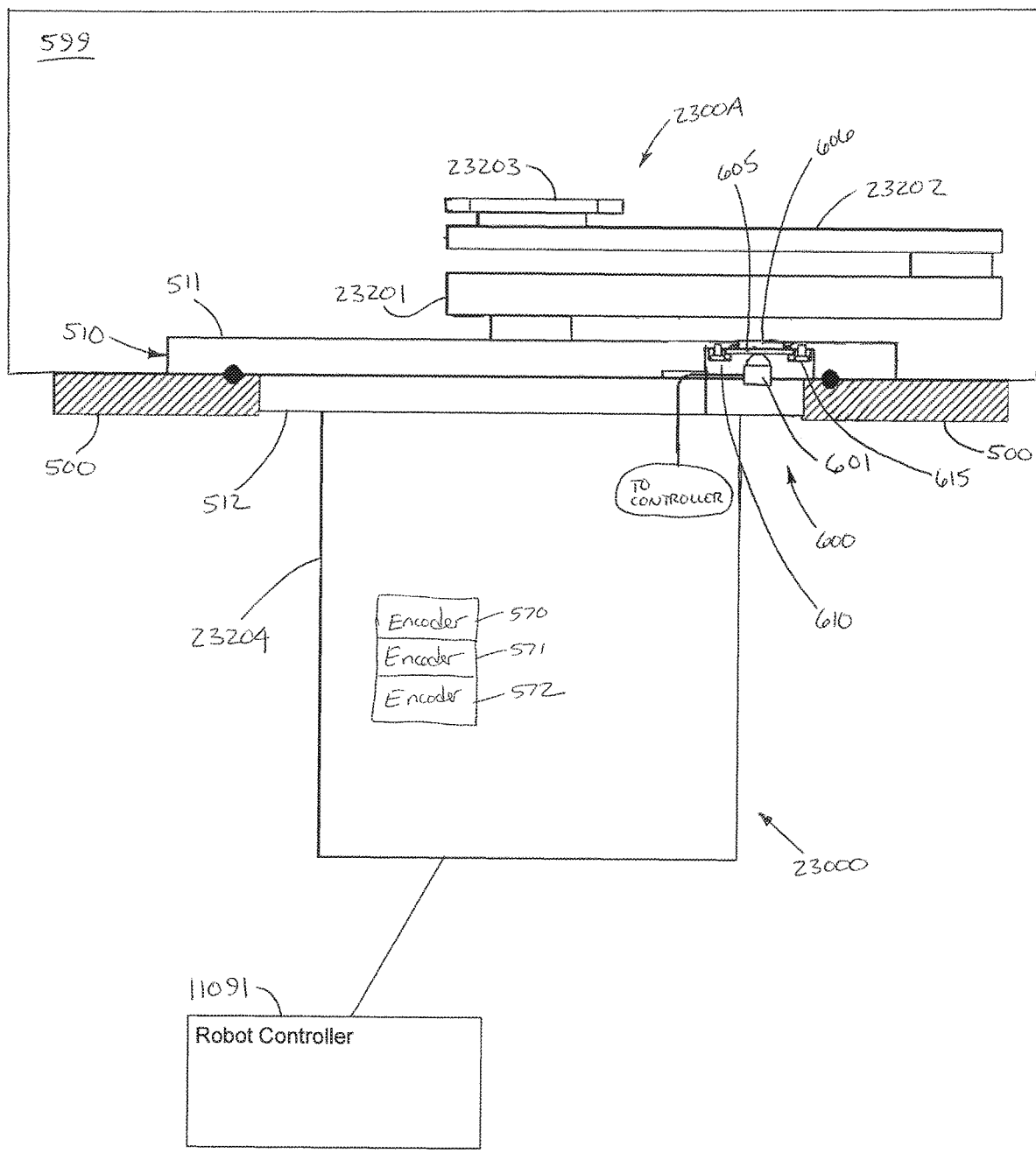
FIG. 6 is a schematic illustration of a portion of a substrate processing apparatus in accordance with aspects of the present disclosure.

Referring also to FIG. 6, the transport apparatus 2300 is illustrated with the arm 2300A mounted inside the vacuum chamber 599. As described above, the arm 2300A includes an end effector 23203 at a distal end of the arm 2300A, configured to support a substrate thereon. The arm 2300A is operably connected to the drive section 23204 which generates, with at least one independent drive axis (as described above), at least arm motion in a radial direction R (see, e.g., FIG. 7) extending and retracting the arm 2300A and moving the end effector 23203, in the radial direction R, from a retracted position (e.g., the bot top center pose as illustrated in, e.g., FIG. 7) to an extended position. The transport apparatus 2300 includes an imaging system 600 with at least one imaging sensor 601 mounted through the mounting interface 510 in a predetermined location with respect to the vacuum chamber 599 and disposed so as to image at least part of the arm 2300A. Each imaging sensor 601 is located proximate the shoulder axis with respect to a distal position of a robot arm 2300A end effector 23203 with the robot 2300A arm extended. In one aspect, the imaging sensor 601 is disposed in or otherwise coupled to a sensor housing 610 that includes a window 605 through which the imaging sensor 601 field of view extends into the interior of the vacuum chamber 599. The window 605 may be constructed of glass or other suitable transparent material and may be chosen depending on a type of vision based information that is to be received by the controller 11091 (e.g., the window provides optical properties that allows for transmission of the wavelengths detected by the imaging sensor and travelling between the vacuum and atmospheric environments). In one aspect, the window 605 transparency may form a lens (i.e., has an integral lensing shape) configured to one or more of focus (e.g., on a particular portion of the vacuum chamber 599 interior and/or transport robot) the imaging sensor 601 field of view, enlarge the imaging sensor 601 field of view, and change a direction of the field of view of the imaging sensor 601 so as to view various/different portions of the vacuum chamber 599 interior or otherwise, at least in part, define the field of view and imaging characteristics of the imaging sensor 601. In other aspects, the window 605 may be configured to receive a lens (i.e., a lens may be coupled to the window), where the lens, coupled to the window 605, is configured to one or more of focus the imaging sensor 601 field of view, enlarge the imaging sensor 601 field of view, and change a direction of the field of view of the imaging sensor 601 in a manner similar to that described above (e.g., the lens may be a wide angle lens that may be fixed relative to the window 605 or have a variable/adjustable viewing characteristics, where a lens adjustment system may be disposed on the window 605 exterior to the vacuum chamber). The window 605 is configured to form a boundary across the pressure differential between the vacuum environment within the vacuum chamber 599 and the atmospheric environment outside of the vacuum chamber 599. The window 605 may be aligned with an aperture 606 of the mounting interface 510 and the sensor housing 610 and/or window 605 is/are sealed against the mounting interface 510 on the portion 512 of the mounting interface 510 exposed to the atmospheric environment. In one aspect, a size of the window 605 (and aperture 606) is not limited by an aperture size of the imaging sensor 601 such that the window may be larger than the imaging sensor 601 aperture to provide an unrestricted imaging sensor 601 field of view into the vacuum chamber 599. In other aspects, the window 605 and transparency of the window 605 is oversized with respect to the mounting interface 510, and the imaging sensor 601 has an aperture so that the window 605 sets the imaging sensor field of view (e.g., as a wide field of view or a field of view having any suitable size) within the vacuum chamber 599. In still other aspects, the sensor housing 610 may be omitted such as where the window 605 is retained against the mounting portion 512 of mounting interface 510 by a window clamp ring 615 or other suitable fastener constructed of any suitable material such as, for example, acetal homopolymer resin. The imaging sensor 601 may be any suitable imaging sensor such as a CCD or CMOS sensor, an infrared sensor, and/or an infrared camera that is mounted to the mounting interface 510 or otherwise positioned in any suitable manner so that the imaging sensor 601 field of view extends through the window 605 and aperture 606 into the interior of the vacuum chamber 599.

The controller 11091 is communicably connected to the imaging system 600 (e.g., through suitable wired and/or wireless connections) and is configured to image, with the imaging sensor 601, at least part of the arm 2300A (or at least part of a set of one or more indicia provided on the arm 2300A as described herein) moving to or in a predetermined repeatable position/pose (e.g., the bot top center pose or other predetermined pose) defined by the at least one independent drive axis, or in other aspects, to image, with the imaging sensor 601, the at least part of the robot arm 2300A (or at least part of a set of one or more indicia on the arm as described herein) moving along a path defined by the at least one independent drive axis to or in the predetermined location. The controller is configured to calculate a positional variance of the at least part of the robot arm 2300A, or a substrate holding station of the end effector 23203 of the multi-link robot arm 2300A, from comparison of the first or subsequent image with a calibration image of the at least part of the robot arm 2300A, or at least part of the set of one or more indicia 701-702 (as described herein) on the multi-link robot arm 2300A, and from the positional variance determine a motion compensation factor changing the extended position of the robot arm 2300A, wherein each imaging sensor 601-603 effecting capture of the first or subsequent image is disposed inside the perimeter of the mounting interface 510. The at least part of the set of one or more indicia 701-702 captured in the first or subsequent image is determinative of the positional variance of the substrate holding station of the end effector 23203. The positional variance calculated by the controller from the comparison of the first or subsequent image and calibration image of the at least part of the robot arm 2300A include a positional variance component in the radial direction and another variance component in a direction angled at a non-zero crossing angle with the radial direction, and the motion compensation factor changes the extended position of the robot arm 2300A in at least one of the radial direction and in the angled direction (see at least FIGS. 10A and 10B described herein). The at least part of the robot arm 2300A captured in the first or subsequent image includes the end effector 23203 with a substrate thereon, which end effector 23203 with substrate being imaged in the first or subsequent image, and the controller 11091 determines a substrate eccentricity with respect to a predetermined substrate hold position of the end effector in a manner similar to that described in U.S. patent application Ser. No. 16/257,595 entitled "Automatic wafer centering method and apparatus" filed on Jan. 25, 2019, the disclosure of which is incorporated herein by reference in its entirety.

The controller effects capture of a first image of at least part of the arm 2300A on registry of the arm 2300A proximate to or in the predetermined repeatable position or proximate to or in the predetermined location. Registry of the arm 2300A may occur at installation of the arm 2300A to the at least one independent drive axis with the at least one drive axis in a predetermined orientation such that the encoder(s) 570-572 (see also FIG. 5) of the at least one drive axis are at a home or zeroed position (e.g., the home or zeroed position being the position from which a degree of rotation (and arm extension) of the at least one drive axis is measured). As described above, this home or zeroed position of the at least one drive axis, in one aspect, corresponds to the bot top center pose. As will be further described herein, with brief reference to FIG. 7, at least one link of the robot arm 2300A has a feature that describes linear and rotational characteristics of a position with respect to a predetermined plane, wherein the controller 11091 registers the linear and rotational characteristics of a position based on an image of the feature captured with the imaging system. In one aspect, the feature that describes or otherwise characterizes both the linear and rotational characteristics of the arm position, or at least one link of the multi-link robot arm 2300A with respect to the radial (extension/retraction) direction, comprise a set of one or more targets or indicia 701-702 on the arm 2300A that are imaged by the imaging sensor 601 to determine thermal and other effects on the arm 2300A. On registry of the arm 2300A (at a predetermined registry/calibration temperature), the imaging sensor 601 images the arm 2300A and the target(s) 701-702 to calibrate the arm 2300A and determine the baseline measurements (e.g., in what may be referred to as a calibration image) of the arm 2300A.

It is noted that if the arm 2300A is removed and replaced with a different arm, the calibration of the different arm may be simplified by imaging the target(s) of the different arm with the at least one drive axis at the home or zeroed position and comparing the image of the different arm with the calibration image. As such, the imaging sensor 601 can be pre-calibrated to the drive section 23204/arm 2300A and installed substantially with the drive section 23204 as a unit module. While the aspects of the present disclosure are described herein with respect to resolving effects on the transport arm due to, for example, thermal effects, the aspects of the present disclosure may also be employed to monitor temperature of the arm links, such as by including non-contact thermal sensors (e.g., infrared sensors, infrared cameras, etc.), as noted above, in lieu of or in combination the imaging sensor 601, mounted through the mounting interface/flange 510 in the manner described herein without intruding into the process environment of the vacuum chamber 599.

Figure 7:
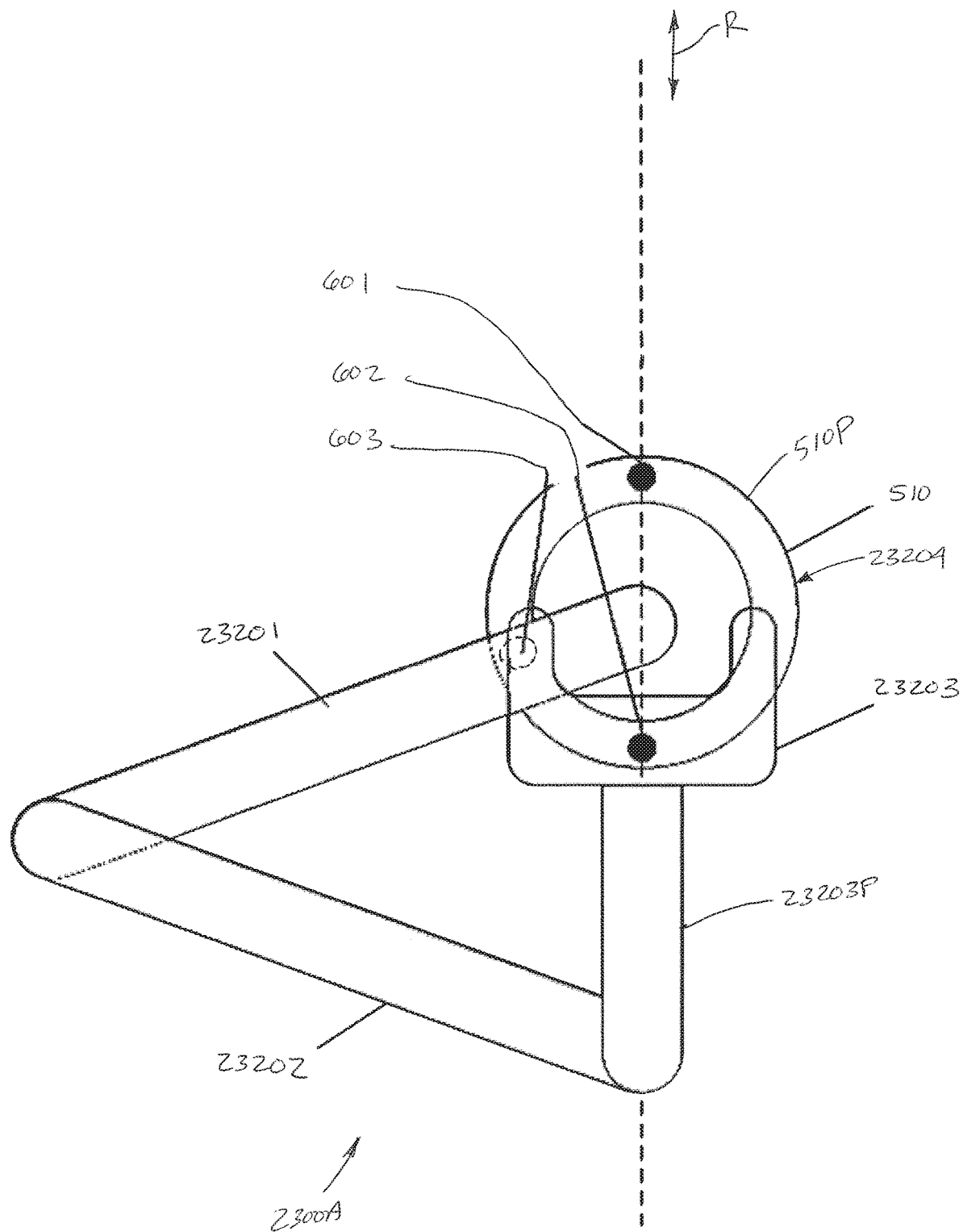
FIG. 7 is a schematic illustration of a substrate transport of a substrate processing apparatus in accordance with aspects of the present disclosure.

Referring to FIG. 7, exemplary imaging sensor 601 (or other suitable sensor(s)) locations are illustrated. In FIG. 7 there are three imaging sensors 601-603 coupled to the mounting interface 510 in the manner described herein. The three imaging sensors 601-603, at the exemplary locations shown, may be employed to measure points/locations on the arm 2300A that are identified with any suitable targets. For example, referring also to FIGS. 8A and 8B, targets 700-702 may be located at any suitable position(s) along the arm 2300A, such as along the upper arm 22301, the forearm 23202, and the end effector 23203. For example, target 700 may be disposed on the upper arm 23201. Target 701 may be disposed at a wrist bearing location (e.g., at the rotation axis of the wrist coupling the end effector 23203 to the forearm 23202) of the forearm 23202. Target 702 may be disposed on a wrist plate 23203P of the end effector 23203. The targets 700-702 are disposed on the arm and configured so as to provide, when imaged by one or more of the imaging sensor(s) 601-603, the respective position and orientation of the respective arm link along a predefined plane in space (e.g., such as a substrate transport plane or a plane in which the arm link operates). The targets 700-702 may be embedded into the respective links of the arm 2300A through a machining/etching/engraving process or be coupled to the arm 2300A in any suitable manner.

Figure 16:
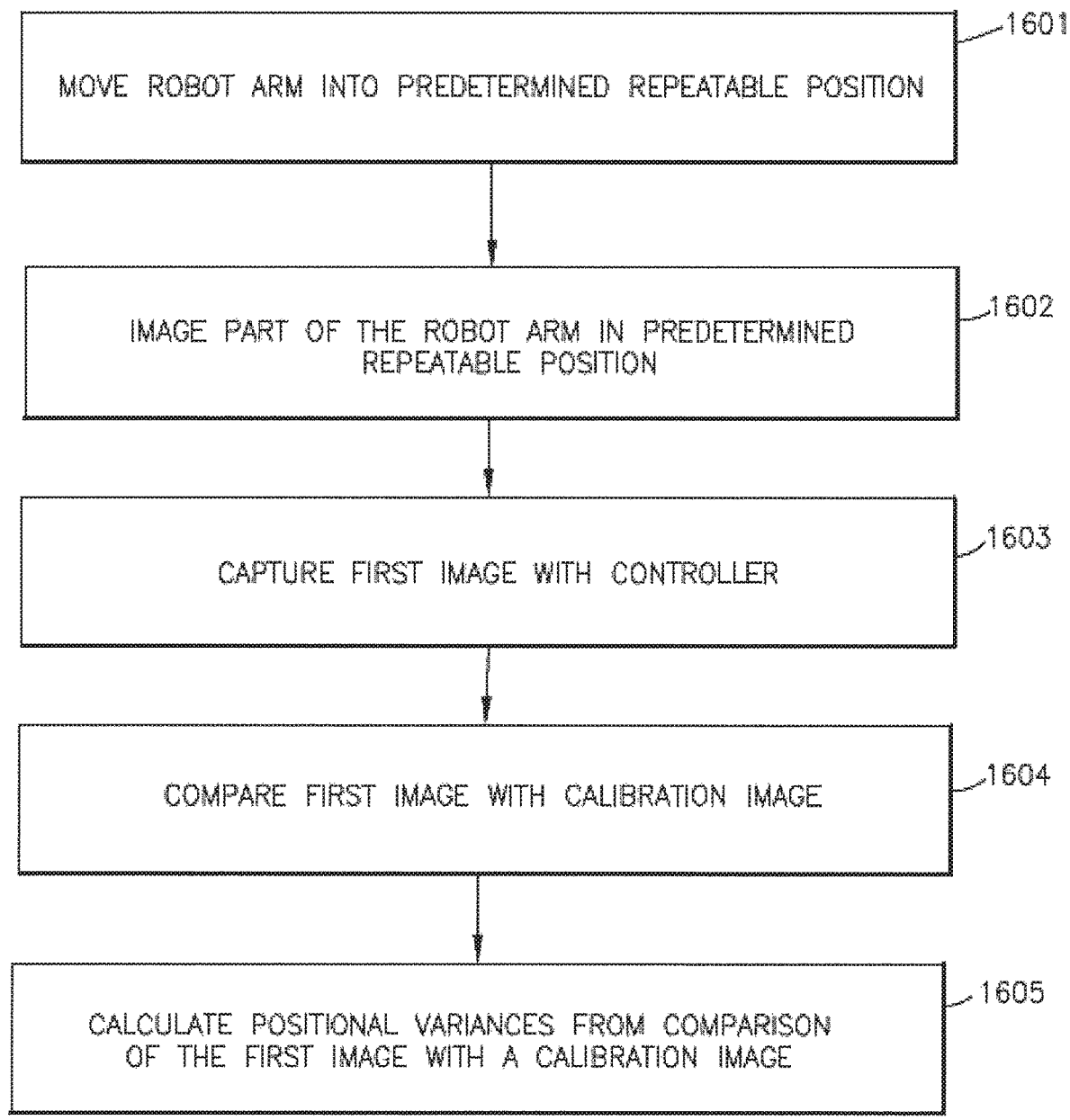
FIG. 16 is a flow chart of a method of operation of a substrate transport apparatus in accordance with one or more aspects of the disclosed embodiment.

As can be seen in FIG. 8B the targets 700-702 may have any suitable configuration such as a cross configuration 700A, a circle configuration 700B, and a double cross-hair configuration 700C. The targets 700-702 may be configured such that as the respective arm link expands and contracts an identifiable change in the shape of the target 700-702 (e.g., an elongation of shortening) may be detected by the imaging system 600 when compared to, for example, the baseline measurements. For example, referring also to FIG. 16 the arm 2300A moves into the predetermined repeatable position for example, in a. (fully) retracted bot top center pose (or other predetermined position—see FIGS. 7, 8A and 8C) (FIG. 16, Block 1601). While in the predetermined repeatable position the imaging sensor 601 images and the controller 11091 captures at least a subsequent image of the target 700-704 on the arm 2300A (FIG. 16, Blocks 1602 and 1603). The subsequent image is compared to the calibration image (FIG. 16, Block 1604). A position variance is determined based on comparison of the two images (FIG. 16, Block 1605).

In other aspects, the position of the target 700-704 in the field of view of the respective imaging sensor 601-603 may change compared to the baseline measurements. The controller 11091 may identify/detect this change in shape or position of the target 700-702 and determine the thermal expansion/contraction of the arm links for modifying controlled movement of the arm 2300A for picking and placing substrates. The measurements of one or more target locations may be taken either simultaneously or at different times. For example, referring to FIGS. 8A and 8C, due to arm kinematics it may not be possible to get all target measurements simultaneously. However, the measurements can be taken at different arm positions to accommodate the mechanism and/or motion constraints of the arm 2300A (compare FIGS. 8A and 8C where the arm 2300A is extended to measure target 701 located at the wrist bearing location). For applications were these measurements are used for thermal expansion compensation of the overall end-effector 23203 position, measurements from different locations may be taken at different times where the time interval between measurements from the different locations on the arm 2300A are limited as a fraction of a time constant of the arm/wafer thermal system.

To track accurate arm locations in space (e.g., within the arm processing environment), the imaging system 600 may be employed by controller 11091 to obtain information to effect tracking changes in the arm 2300A relative to reference or baseline measurement values. The reference or baseline can be defined as the measurement (e.g., an image and/or a temperature) at known location(s) (e.g., reported by suitable position feedback devices such as encoders 570-572) and condition(s) (e.g., such as ambient temperature). For example, referring to FIG. 5, the encoders 570-572 may be rotary (or other suitable) encoders that provide the controller 11091 with an absolute position of each arm drive shaft 23668a-23668c. For exemplary purposes only, at room temperature the arm may be at a location as indicated in FIG. 7. In the arm 2300A position shown in FIG. 7 and a measured ambient temperature condition, the drive shaft encoder positions are uniquely correlated with the target images recorded by the imaging sensors 600-602 that overlap with the upper arm 23201 and end-effector 23203 as indicated. These images are employed by the controller 11091 as the "reference or baseline measurement values". As the arm 2300A is used over time and performing high temperature wafer handling operations, the arm 2300A and end-effector 23203 temperatures will rise and as a result the link lengths will change relative to the reference or baseline condition. The controller 11091 is configured (e.g., programed) to activate the imaging sensor(s) 601-603 to capture images of the targets 700-702 when the drive shaft 23668a-23668c positions reach the predefined reference locations. Due to arm 2300A thermal expansion the locations of the targets 700-702 within the images and/or the shape of the targets 700-702 will change in position and/or orientation.

Figure 10A:
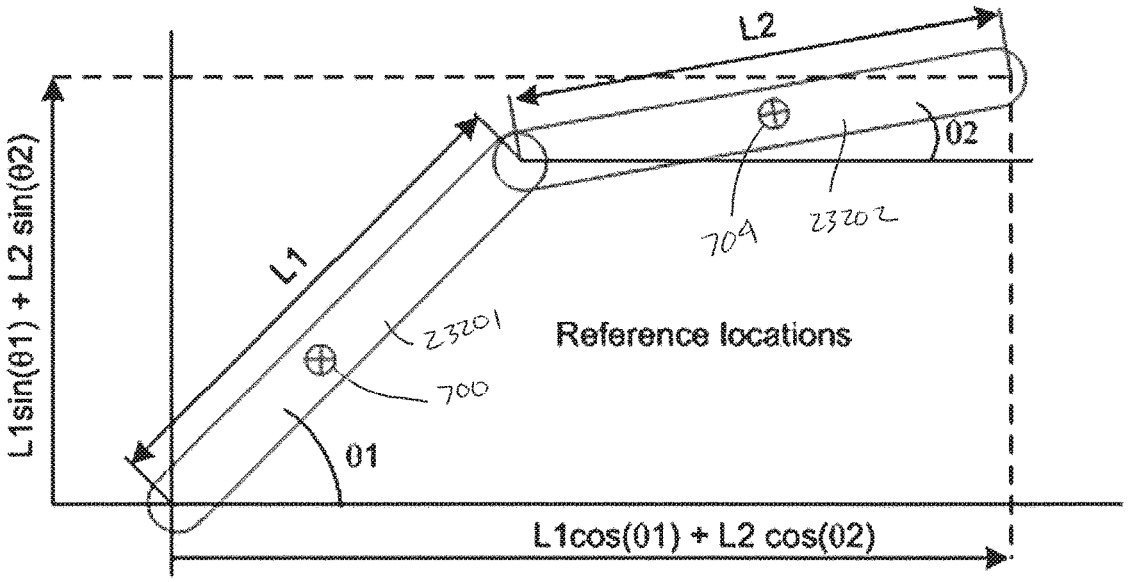
FIG. 10A is a schematic illustration of a kinematic model of a substrate transport arm at baseline conditions in accordance with aspects of the present disclosure.
Figure 10B:
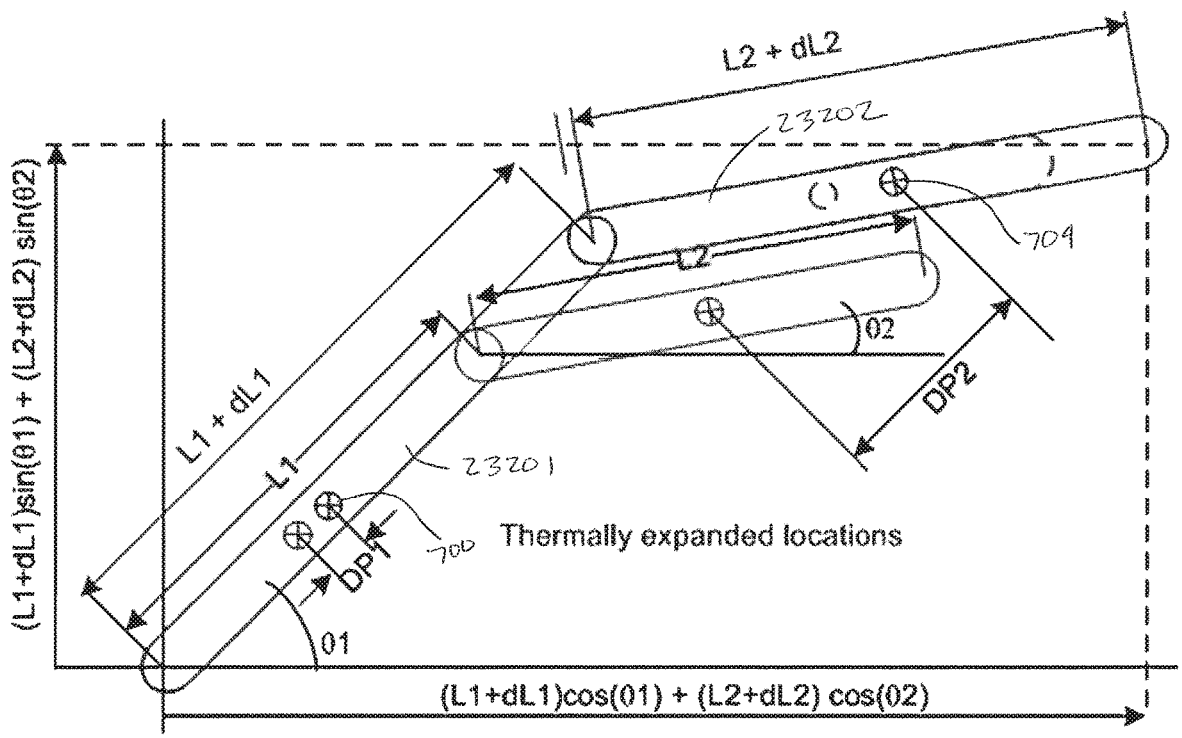
FIG. 10B is a schematic illustration of a kinematic model of a substrate transport arm at non-baseline conditions in accordance with aspects of the present disclosure.
Figure 11:
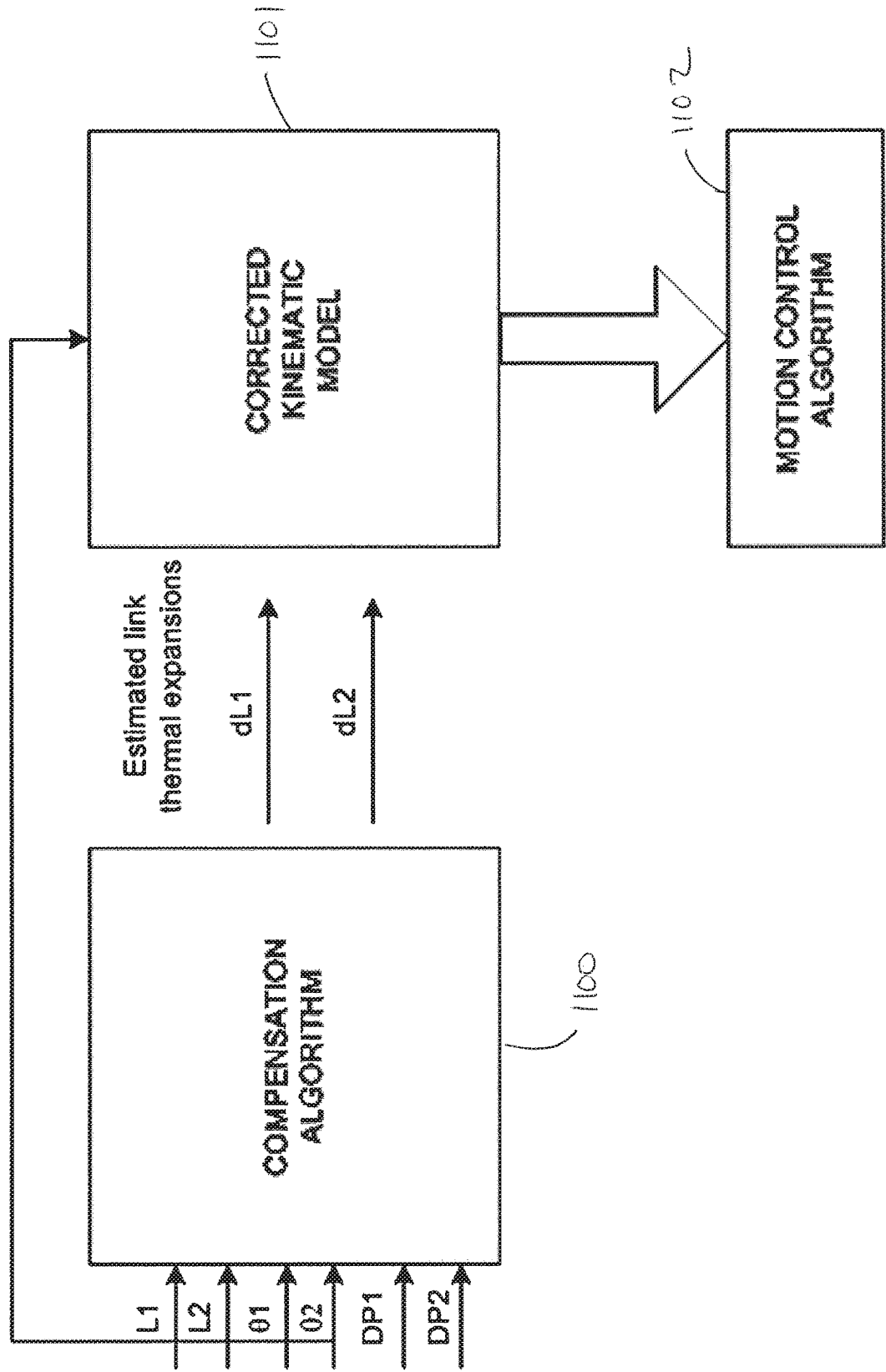
FIG. 11 is an exemplary schematic controller flow diagram for kinematic model correction in accordance with aspects of the present disclosure.

Referring also to FIG. 9, the controller 11091 is configured to calculate an amount of translation, deformation, and/or rotation of the target 700-702 in the "new" or subsequent image 901 relative to the reference/baseline image 902 as indicated by the vector DP and the rotation Rz, respectively. Calculation of an amount of translation, deformation, and/or rotation may be performed for each target 700-702 that can be measured by its respective imaging sensor. In accordance with aspects of the present disclosure the quantities $DP_i$ and $Rz_i$ of each measured variability reported by each target "i" located in/on the arm 2300A can be employed by the controller 11091 (such as by a kinematic resolver 11091K (see FIG. 1A) of the controller 11091) to calculate a more precise kinematic model (when compared to a kinematic model that does not consider thermal effects of the arm 2300A) of the substrate transport apparatus 2300. Referring also to FIGS. 10A and 10B and 11 an exemplary modification of the kinematic model based on thermal effects is illustrated. In this example, a 2-link arm is illustrated but in other aspects the robot arm may have more or less than two links. Here, each arm link (e.g., such as the upper arm 23201 and forearm 23202) is subjected to thermal expansion relative to a reference ambient temperature. FIG. 10A illustrates the kinematic model (e.g., arm lengths L1, L2, arm angles 61, 62, etc.) employed by controller 11091 without thermal expansion (e.g., a baseline kinematic model). FIG. 10B illustrates the kinematic model under thermal expansion (e.g., where dL1 and dL2 represent the changes in length of the respective arm links over baseline dimensions and DP1, DP2 represent the changes in locations of targets 700, 704 of the upper arm 23201 and forearm 23202). The changes in location of the targets DP1, DP2 as determined with the controller 11091 based on information from the imaging system 600 are employed to estimate the link thermal expansions dL1 and dL2 such that the kinematic model can be corrected to better determine the arm location in space. For example, referring to FIG. 11, the controller 11091 is configured with a compensation algorithm 1100 that uses as inputs, e.g., L1, L2, 61, 62, DP1, and DP2 to determine dL1 and dL2 and generate a corrected kinematic model 1101 to compensate for thermal effects on the arm 2300A. The controller 11091 employs the corrected kinematic model 1101 in a motion control algorithm 1102 for generating arm 2300A movements for picking and placing substrates at substrate holding locations of the substrate processing system (such as those described herein).

Figure 12:
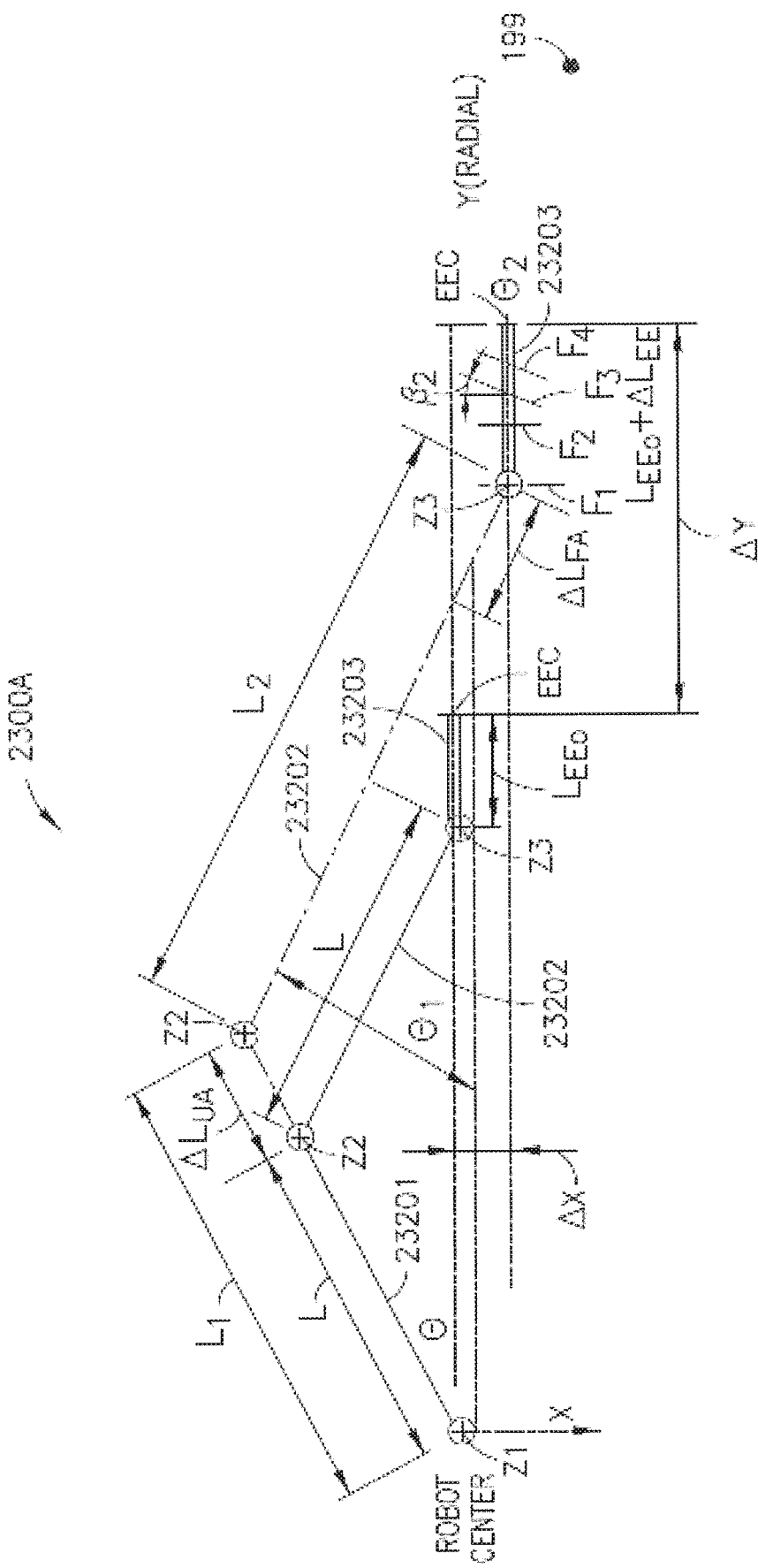
FIG. 12, is a schematic illustration expansion of arm links of a substrate transport in accordance with aspects of the present disclosure.

Referring to FIG. 12, an exemplary determination of changes in the arm 2300A due to thermal expansion will be described in greater detail. As described above, the targets 700-704 each have a configuration that is determinative, e.g. on sensing of at least one target 700-704 by the imaging system 600, of a discrete variance(s) in the SCARA arm link 23201, 23202, 23203 lengths $\Delta L_i$, and pulley effects $\Delta V_i$ due to changes in temperature of each respective SCARA arm link 23201, 23202, 23203. For example, the at least one target 700-704 is disposed on the SCARA arm 2300A so that the imaging system 600 detects the target at the predetermined positions (e.g., in one aspect on the fly with the radial motion of the SCARA arm 2300). Here the targets 700-704 determine discrimination between each of the different discrete variances (e.g. $\Delta L_i$) of each different SCARA arm link 23201, 23202, 23203 due to different changes in temperature $\Delta T_i$ at each SCARA arm link 23201, 23202, 23203 and thus, discriminately applies the respective different discrete variance to determine the respective pulley variance $\Delta V_i$ and corresponding non-linear effects (contribution) to the variance of the SCARA arm. The discrete variances can be expressed with corresponding proportion or expansion factors ($K_{S(i)}$), in a manner similar to that described in U.S. patent application Ser. No. 15/209,497 entitled "On the fly automatic wafer centering method and apparatus" filed on Jul. 13, 2016 (the disclosure of which is incorporated herein by reference in its entirety), relating variances to predetermined datum references (e.g. reference temperature $T_{REF}$ and the initial link lengths $L_i$ at the reference temperature).

The configuration of the targets 700-704 is deterministic for discrimination (or as per above deterministic discrimination between each of the different discrete variances) of a 3 link SCARA arm 2300A having the upper arm link 23201, the forearm link 23202 and the end effector 23203, but in other aspects the targets 700-704 can have any suitable configuration for deterministic discrimination of an n-link arm (e.g. an arm having any suitable number of arm links). The configuration of the targets 700-704 is deterministic for discrimination of the different discrete variances ($\Delta L_i$, $\Delta V_i$), or the expansion factor(s) $K_{S(i)}$, from sensing a position of the targets 700-704 as described in greater below with respect to equations [1]-[4].

In one aspect, the controller 11091 (or the kinematic resolver 11091K of the controller) is configured to determine, from the detection of at least target 700-704 different discrete variances $\Delta L_i$ respective to each arm link 23201, 23202, 23203, and discriminate between the different discrete variances in determining the SCARA arm variance (e.g. $\Delta X$, $\Delta Y$ or R, θ depending on the coordinate system being used) from the shoulder axis Z1 to the reference location EEC (i.e. the wafer/end effector center location) of the end effector 23203. As noted before, with the variance expressed as an expansion factor $K_{S(i)}$ corresponding to each arm link 23201, 23202, 23203, the controller 11091 is configured to determine from detection of the targets the discrete relation between the different expansion factors $K_{S(i)}$ of each corresponding arm link 23201, 23202, 23203, discriminating between the different expansion factors $K_{S(i)}$ of different corresponding arm links 23201, 23202, 23203 in determining the variance to the reference location EEC of the end effector 23203. In other words, the controller includes the kinematic effects resolver which is configured to determine, from the detection of at least one target 700-704 by the imaging system 600, a discrete relation between the determined proportion factor $K_{S(i)}$ and each different discrete variance $\Delta L_i$ respective to each different arm link 23201, 23202, 23203 of the SCARA arm 2300A determining the variance of the SCARA arm on the fly with the radial motion of the SCARA arm 2300A. From the detection of the at least one target 700-704 the controller 11091 is configured to determine the variance $\Delta X$, $\Delta Y$ of the SCARA arm 2300A in one pass of the SCARA arm 2300 by a respective imaging sensor 601 of the imaging system 600. Further, the controller 11091 (or the kinematic resolver 11091K) is configured to resolve non-linear kinematic effects $\Delta V_i$ of the respective pulleys (see e.g. pulleys of FIG. 3)) due to the change in temperature $\Delta T_i$ discriminating between the different respective non-linear kinematic effects $\Delta V_i$ of the respective pulleys due to different temperatures at the arm joints or pulley axes Z1, Z2, Z3. The pulley variance corresponding to the non-linear kinematic effects $\Delta V_i$ may be expressed as a pulley drive ratio between pulleys at opposite ends of each respective arm link 23201, 23202, 23203.

Referring to FIG. 12, for exemplary purposes and convenience the transport apparatus is illustrated as having a single SCARA arm where the upper arm and forearm links 23201, 23202 of the SCARA arm 2300A are illustrated as having the same length L at the reference temperature $T_{REF}$ however in other aspects, the upper arm and forearm links may have unequal lengths. In other aspects the aspects of the present disclosure may be applied to any suitable arm. Further, for exemplary purposes and convenience the SCARA arm links are constructed of similar materials so as to have similar coefficients of thermal expansion but in other aspects, the arm links may be constructed of different material so as to have different coefficients of thermal expansion. In one aspect, for exemplary purposes only the upper arm link 23201 and forearm link 23202 are driven by respective motor axes while the end effector 23203 is slaved to the upper arm link 23201. The SCARA arm 2300A, is illustrated in FIG. 12 under the same motor positions, before and after thermal expansion (the thermally expanded arm is illustrated in phantom lines). The general kinematics of the SCARA arm can be written as:

At the reference temperature:

$$Y(\theta)=2L\cos(\theta)+L_{EE0}$$

$$X(\theta)=0$$

After temperature heat up and thermal expansion:

$$Y(\theta)=L_1\cos(\theta)+L_2\cos(\theta_1)+(L_{EE0}+\Delta L_{EE})\cos(\theta_2)$$

$$X(\theta)=L_2\sin(\theta_1)-L_1\sin(\theta)+(L_{EE0}+\Delta L_{EE})\sin(\theta_2)$$

Where:

$$\theta_1 = (G_1 - 1)\theta$$

$$\theta_2 = \left(\frac{G_1}{G_2} - G_1 + 1\right)\theta$$

and $G_1$ and $G_2$ are pulley gear ratios for upper arm to elbow and wrist to elbow.

At the calibration temperature $T_{REF}$, the upper arm link 23201 and forearm link 23202 each have a length L. After temperature changes the length of the upper arm link 23201 is denoted as L1 and the length of the forearm link 23202 is denoted as length L2.

At the same motor positions, assuming the upper arm temperature changed by $\Delta T_1$, and forearm temperature changed by $\Delta T_2$, and the thermal expansion coefficient for upper arm link 23201 is $\alpha_1$ and the thermal expansion coefficient for the forearm link 23020 is $\alpha_2$, the upper arm length L1 and forearm length L2 after thermal expansion are:

$$L_1 = L + \alpha_1 * \Delta T_1 * L = (1 + \alpha_1 * \Delta T_1) * L = K_{s1} * L; \quad [1]$$

$$L_2 = L + \alpha_2 * \Delta T_2 * L = (1 + \alpha_2 * \Delta T_2) * L = K_{s2} * L; \quad [2]$$

Where the expansion factors are defined as:

$$K_{s1} = (1 + \alpha_1 * \Delta T_1); \quad [3]$$

$$K_{s2} = (1 + \alpha_2 * \Delta T_2); \quad [4]$$

Because the temperatures are distributed from the end effector 23203 to the shoulder axis Z1 of the SCARA arm 2300A, especially during the temperature increase to steady state, the distributed temperature changes the pulley ratios of the pulleys at the SCARA arm joints (e.g. axes Z1, Z2, Z3) due to thermal expansion of the pulleys at different rates. This thermal expansion of the pulleys will change the included angle and the end effector orientation. Referring again to FIG. 27, an example of simulation results to show the impact of pulley drive ratio changes on the end effector center EEC assuming the pulleys are at different temperatures but the link length is unchanged.

The following table illustrates exemplary pulley drive ratios for the pulleys of the SCARA arm 2300A, where the location of the pulley is identified and the diameter is represented in generic units of measure

| Location | Diameter |
|---|---|
| UA shoulder | 2 |
| UA Elbow | 1 |
| FA Elbow | 1 |
| FA Wrist | 2 |

For the SCARA arm 2300A, the shoulder axis Z1 is connected to the elbow axis Z2 with a transmission including pulleys having a 2:1 drive ratio, and the wrist axis Z3 is connected to the elbow axis Z2 with a transmission including pulleys having a 2:1 drive ratio.

Assuming the temperature change at the shoulder axis Z1 is $\Delta T1$ and the temperature change at the elbow axis is $\Delta T2$, and $\alpha$ is the thermal coefficient of the arm link material, the pulley ratio of the shoulder axis Z1 to the elbow axis Z2 may be expressed as:

$$G_1 = 2*(1 + \alpha*\Delta T1)/(1 + \alpha*\Delta T2);$$

Using equations [3] and [4]:

$$G_1 = 2*K_{s1}/K_{s2}; \quad [5]$$

Therefore the angle after the change in pulley ratio is:

$$\theta_1 = (2*K_{s1}/K_{s2} - 1)*\theta; \quad [6]$$

Assuming the temperature change on the end effector is $\Delta T_3$, the pulley ratio between the wrist axis Z3 and the forearm axis Z2 may be expressed as:

$$G_2 = 2*(1 + \alpha*\Delta T3)/(1 + \alpha*\Delta T2)$$

and the expansion factor can be defined as:

$$K_{s3} = (1 + \alpha*\Delta T3);$$

Then:

$$G_2 = 2*K_{s3}/K_{s2}$$

where the angle change of the end effector 23203 can be expressed as:

$$\theta_2 = \theta*(G_1/G_2 - G_1 + 1) = \theta*(K_{s1}/K_{s3} - 2K_{s1}/K_{s2} + 1); \quad [7]$$

Figure 13:
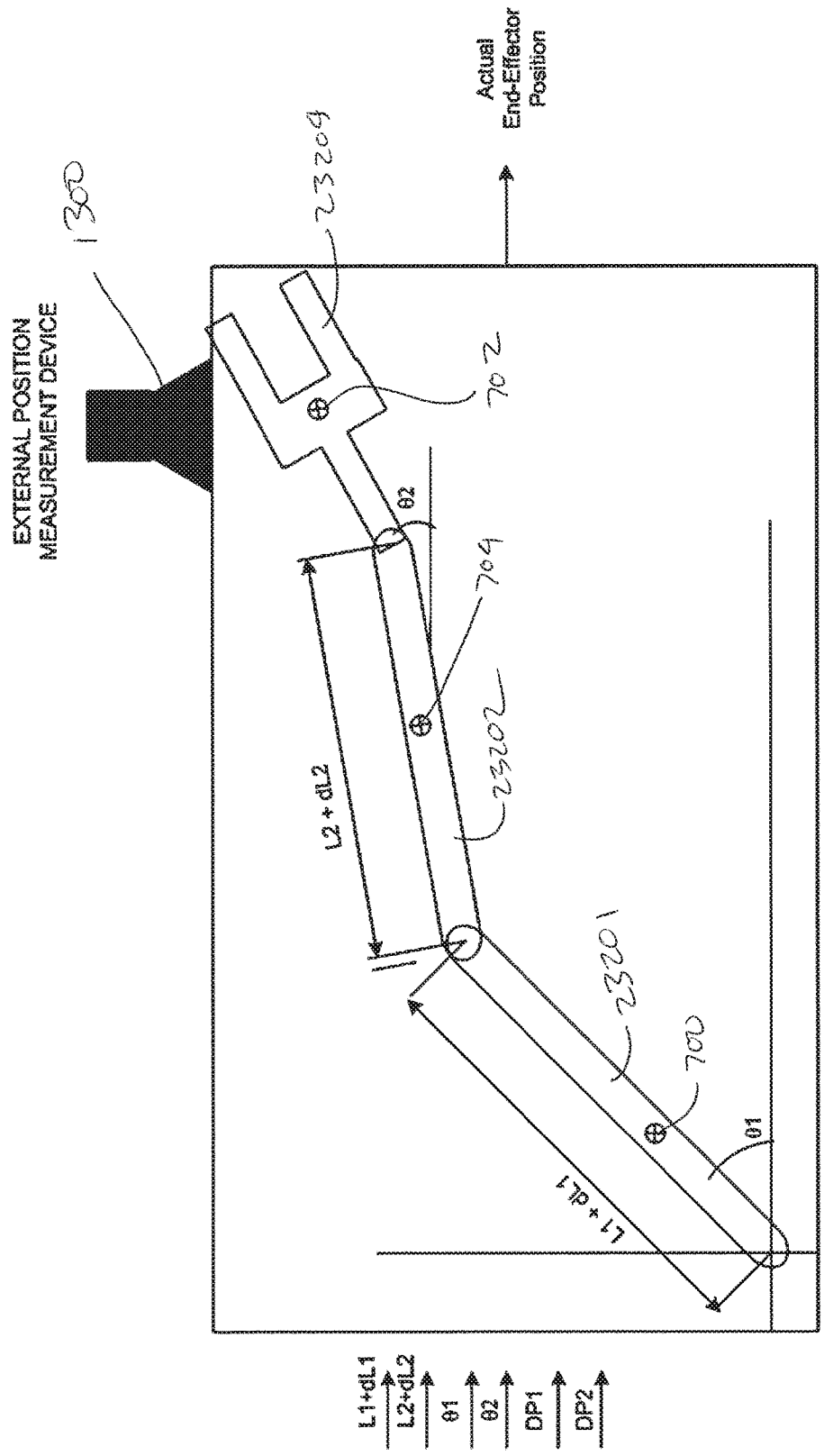
FIG. 13 is an exemplary illustration of training data gathering for a machine learning thermal compensation model in accordance with aspects of the present disclosure.

The "Compensation Algorithm" such as described above, and illustrated in FIG. 11 can be implemented as a result of analytical derivations or Machine Learning methods where a training grid can be implemented with the assistance of external measurement devices that can accurately monitor the actual robot end-effector position in space. FIG. 13 shows an example with respect to obtaining training grid data to develop a Machine Learning based model for robot arm error compensation. Given the environmental conditions and available measurements, the actual end-effector position can be measured with an external device 1300 (e.g., such as a camera or other suitable sensor) for various input conditions in order to provide data to properly train a Machine Learning based model.

Figure 14A:
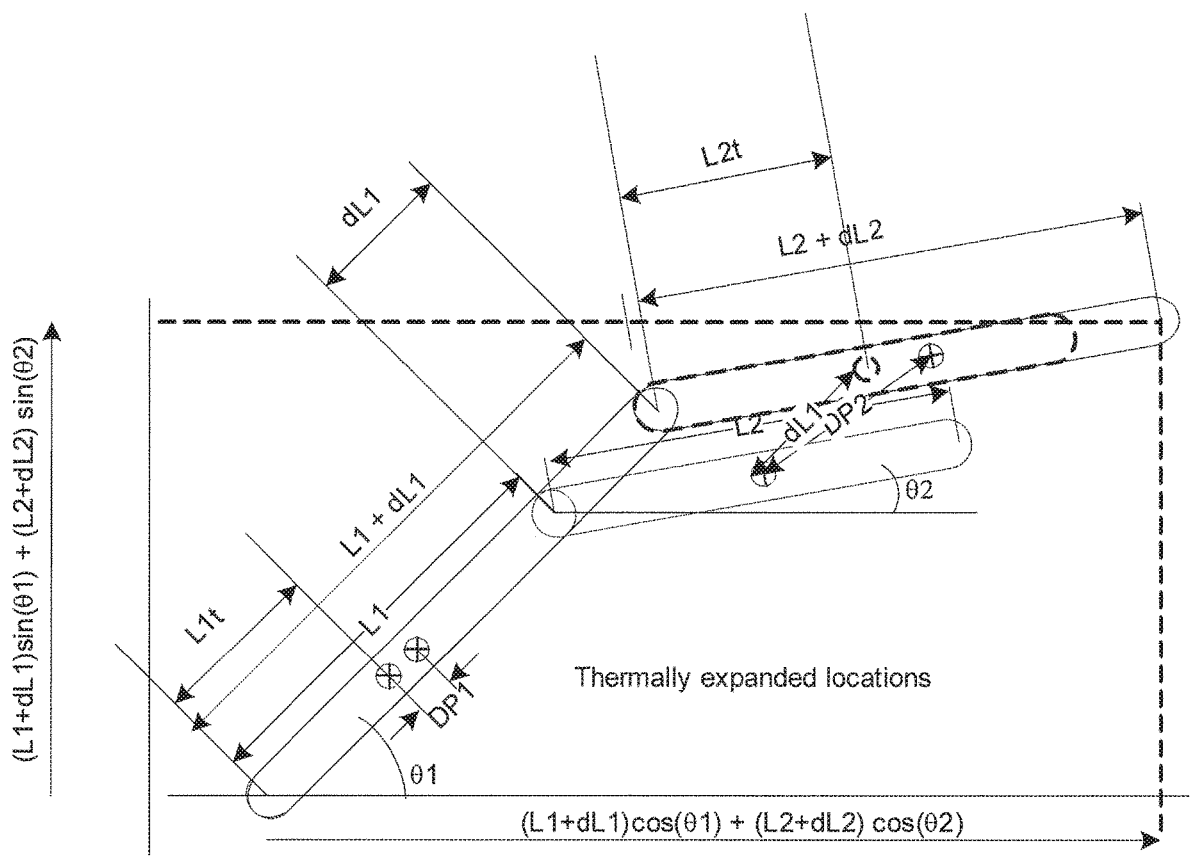
FIGS. 14A and 14B are exemplary illustration for derivation of link length expansion in terms of camera measurement in accordance with aspects of the present disclosure.
Figure 14B:
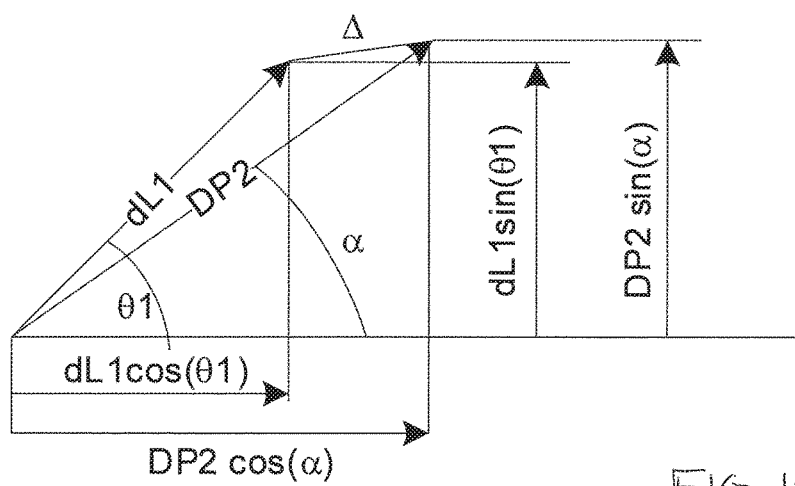

In another aspect, FIGS. 14A and 14B show an example of analytical derivations on how to calculate the link thermal expansions of the upper arm 230201 and Forearm 23202 in terms of the imaging sensor measurements DP1, DP2. It is noted that the analytical derivation may employ the calculated link thermal expansions dL1 and dL2 to correct the robot kinematic model to accurately determine the position of the robot end-effector in space.

Figure 15:
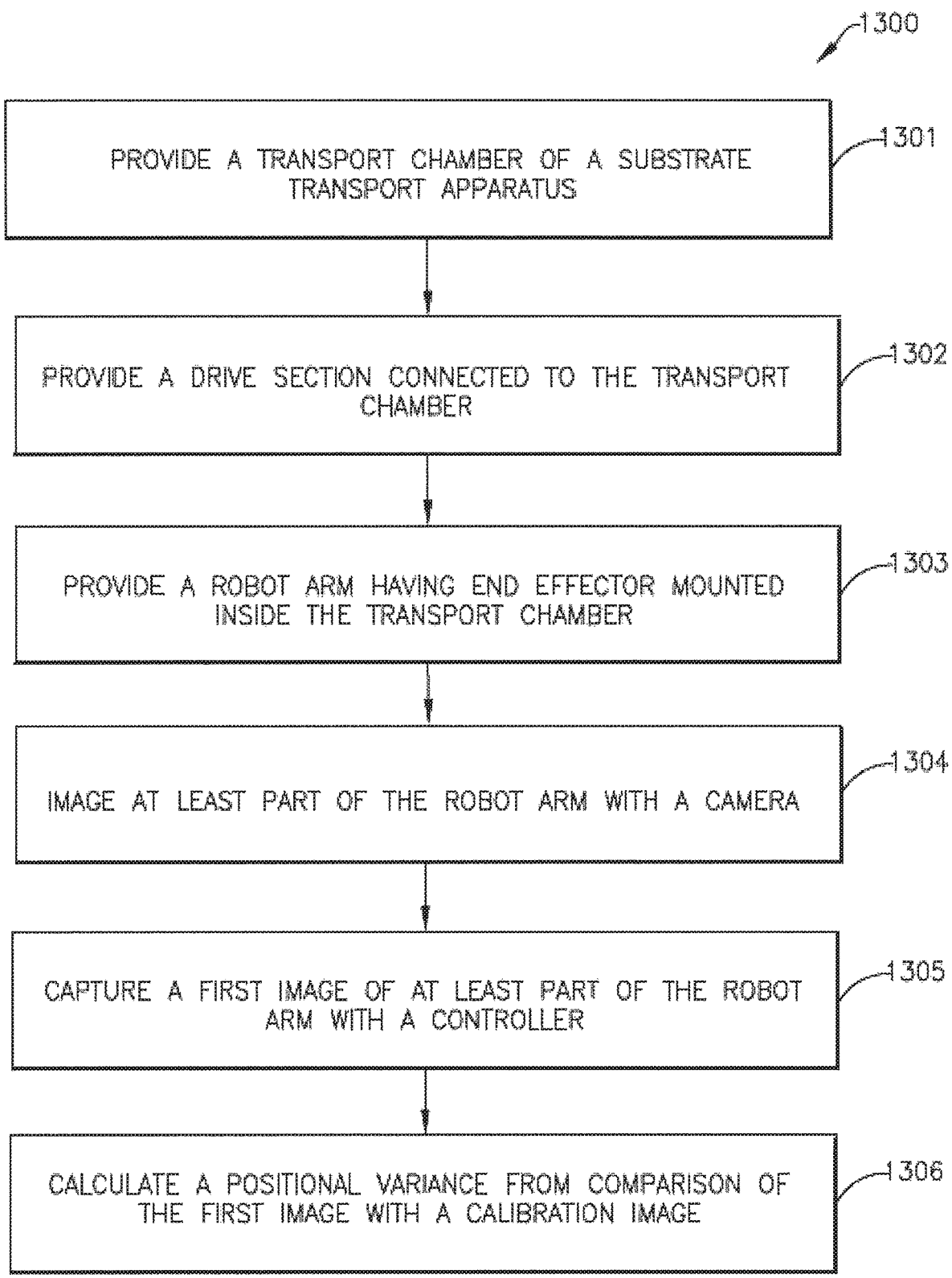
FIG. 15 is a flow chart of a method of operation of a substrate transport apparatus in accordance with one or more aspects of the disclosed embodiment.

Referring now to FIG. 15, an exemplary operation of the aspects of the present disclosure will be described. In one aspect, the method 1300 includes providing a transport chamber (such as those described above) of a substrate transport apparatus (such as those described above) (FIG. 15, Block 1301). The transport chamber has substrate transport opening 1250P in communication with a substrate station module (such as a vacuum chamber or other suitable substrate holding location). The method further includes providing a drive section 23204 with a mounting flange or interface mount 510 connected to the transport chamber (FIG. 15, Block 1302), and having a motor (such as those described herein) defining at least one independent drive axis, the mounting flange 510 mounting the drive section 23204 to the transport chamber and forming a perimeter that separates an interior of the transport chamber on an outside of the perimeter from an exterior of the transport chamber on the inside of the perimeter. The method 1300 further includes providing a robot arm 2300A having end effector 23203 mounted inside the transport chamber (FIG. 15, Block 1303). The robot arm 2300A is operably connected to the drive section 23204 generating, with the at least one independent drive axis, at least arm motion in a radial direction R extending and retracting the robot arm 2300A and moving the end effector 23203, in the radial direction R, from a retracted position to an extended position. While the robot arm 2300A is in one of the predetermined repeatable positions described herein, defined by the at least one independent drive axis, imaging system 600 images, with one or more imaging sensors 601-603 mounted through the mounting flange 510, at least part of the robot arm 2300A (FIG. 15, Block 1304). The imaging system 600 is mounted on the mounting interface 510 in a predetermined location with respect to the transport chamber and the robot arm 2300A is imaged moving to or in the predetermined repeatable position or moving to or in the predetermined location. The controller 11091 captures a subsequent image of at least part of the robot arm 2300A (FIG. 15, Block 1305) on registry of the robot arm 2300A proximate to or in the predetermined repeatable position or proximate to or in the predetermined location. With the subsequent image, a positional variance $\Delta_{PV}$ is identified from comparison of the subsequent image with the calibration image (FIG. 15, Block 1306) to determine a motion compensation factor changing the extended position of the robot arm 2300A, where each imaging sensor effecting capture of the first image is disposed inside the perimeter of the mounting flange as described above.

It is noted that although the aspects of the present disclosure are described with respect to the arm 2300A retracting or in a retracted position, the aspects of the present disclosure may also be used for extension of the arm 2300A. For example, the arm 2300A may have a repeatable extended position that is selected during calibration of the arm 2300A. The repeatable extended position may be, e.g., at the substrate hold position in a processing module which has a known predetermined rotation position (θ rotation of the axis drive) from the drive axis encoder datum. The controller 11091 receives a signal from the encoder when the encoder reaches the known predetermined rotation position to indicate that the arm 2300A is in the repeatable extended position. Once in the repeatable extended position, motion compensation is determined substantially similar to that above with respect to the arm 2300A in the retracted position (i.e., an image is captured and compared with a pre-programmed calibration image).

In accordance with one or more aspects of the present disclosure a substrate transport apparatus comprises:

a transport chamber with a substrate transport opening arranged for communication with a substrate station module;

a drive section with a mounting interface connected to the transport chamber, and having a motor defining at least one independent drive axis, the mounting interface mounting the drive section to the transport chamber and forming a perimeter that separates an interior of the transport chamber on an outside of the perimeter from an exterior of the transport chamber on the inside of the perimeter;

a robot arm mounted inside the transport chamber, and having an end effector at a distal end of the robot arm, configured to support a substrate thereon, the robot arm being operably connected to the drive section generating, with the at least one independent drive axis, at least arm motion in a radial direction extending and retracting the robot arm and moving the end effector, in the radial direction, from a retracted position to an extended position;

an imaging system with a camera mounted through the mounting interface in a predetermined location with respect to the transport chamber and disposed so as to image at least part of the robot arm; and a controller communicably connected to the imaging system and configured to image, with the camera, the at least part of the robot arm moving along a path defined by the at least one independent drive axis to or in the predetermined location, the controller effecting capture of a first image of the at least part of the robot arm on registry of the robot arm proximate to or in the predetermined location, wherein the controller is configured to calculate a positional variance of the at least part of the robot arm from comparison of the first image with a calibration image of the at least part of the robot arm, and from the positional variance determine a motion compensation factor changing the extended position of the robot arm, wherein each camera effecting capture of the first image is disposed inside the perimeter of the mounting interface.

In accordance with one or more aspects of the present disclosure the positional variance calculated by the controller from the comparison of the first image and calibration image of the at least part of the robot arm include a positional variance component in the radial direction and another variance component in a direction angled at a non-zero crossing angle with the radial direction, and the motion compensation factor changes the extended position of the robot arm in at least one of the radial direction and in the angled direction.

In accordance with one or more aspects of the present disclosure the at least part of the robot arm captured in the first image includes the end effector with a substrate thereon, which end effector with substrate being imaged in the first image, and the controller determines a substrate eccentricity with respect to a predetermined substrate hold position of the end effector.

In accordance with one or more aspects of the present disclosure at least one link of the robot arm has a feature that describes linear and rotational characteristics of a position with respect to a predetermined plane, wherein the controller registers the linear and rotational characteristics of a position based on an image of the feature captured with the imaging system.

In accordance with one or more aspects of the present disclosure the robot arm extends and retracts relative to a shoulder axis of the robot arm, the shoulder axis being located on the inside of the perimeter.

In accordance with one or more aspects of the present disclosure each camera is located proximate the shoulder axis with respect to a distal position of a robot arm end effector with the robot arm extended.

In accordance with one or more aspects of the present disclosure a method comprises:

providing a transport chamber of a substrate transport apparatus, the transport chamber having a substrate transport opening arranged for communication with a substrate station module;

providing a drive section with a mounting flange connected to the transport chamber, and having a motor defining at least one independent drive axis, the mounting flange mounting the drive section to the transport chamber and forming a perimeter that separates an interior of the transport chamber on an outside of the perimeter from an exterior of the transport chamber on the inside of the perimeter;

providing a robot arm mounted inside the transport chamber, and having an end effector at a distal end of the robot arm, configured to support a substrate thereon, the robot arm being operably connected to the drive section;

generating, with the at least one independent drive axis, at least robot arm motion in a radial direction extending and retracting the robot arm and moving the end effector, in the radial direction, from a retracted position to an extended position;

imaging, with a camera of an imaging system mounted through the mounting flange in a predetermined location with respect to the transport chamber, at least part of the robot arm moving along a path defined by the at least one independent drive axis to or in the predetermined location defined by the at least one independent drive axis;

capturing, with a controller communicably connected to the imaging system, a first image of the at least part of the robot arm on registry of the robot arm proximate to or in the predetermined location; and calculating, with the controller, a positional variance of the at least part of the robot arm from comparison of the first image with a calibration image of the at least part of the robot arm, and from the positional variance determining a motion compensation factor changing the extended position of the robot arm, wherein each camera effecting capture of the first image is disposed inside the perimeter of the mounting flange.

In accordance with one or more aspects of the present disclosure the method further comprises calculating the positional variance, with the controller, from the comparison of the first image and calibration image of the at least part of the robot arm includes comparing a positional variance component in the radial direction and another variance component in a direction angled at a non-zero crossing angle with the radial direction, and the motion compensation factor changes the extended position of the robot arm in at least one of the radial direction and in the angled direction.

In accordance with one or more aspects of the present disclosure the at least part of the robot arm captured in the first image includes the end effector with a substrate thereon, which end effector with substrate being imaged in the first image, the method further comprising determining, with the controller, a substrate eccentricity with respect to a predetermined substrate hold position of the end effector.

In accordance with one or more aspects of the present disclosure at least one link of the robot arm has a feature that describes linear and rotational characteristics of a position with respect to a predetermined plane, the method further comprising registering, with the controller, the linear and rotational characteristics of a position based on an image of the feature captured with the imaging system.

In accordance with one or more aspects of the present disclosure the robot arm extends and retracts relative to a shoulder axis of the robot arm, the shoulder axis being located on the inside of the perimeter.

In accordance with one or more aspects of the present disclosure each camera is located proximate the shoulder axis with respect to a distal position of a robot arm end effector with the robot arm extended.

In accordance with one or more aspects of the present disclosure a substrate transport apparatus comprises:

a transport chamber with a substrate transport opening arranged for communication with a substrate station module;

a drive section with a mounting interface connected to the transport chamber, and having a motor defining at least one independent drive axis;

a multi-link robot arm mounted inside the transport chamber, and having an end effector at a distal end of the multi-link robot arm, configured to support a substrate thereon, the multi-link robot arm being operably connected to the drive section generating, with the at least one independent drive axis, at least arm motion in a radial direction extending and retracting the multi-link robot arm and moving the end effector, in the radial direction, from a retracted position to an extended position;

a set of one or more indicia on the multi-link robot arm that characterize both linear and rotational characteristics of at least one link of the multi-link robot arm with respect to the radial direction;

an imaging system with at least one imaging sensor mounted through the mounting interface in a predetermined location with respect to the transport chamber and disposed so as to image at least part of the set of one or more indicia on the multi-link robot arm; and a controller communicably connected to the imaging system and configured to image, with the at least one imaging sensor, the at least part of the set of one or more indicia on the multi-link robot arm moving along a path defined by the at least one independent drive axis to or in the predetermined location, the controller effecting capture of a first image of the at least part of the set of one or more indicia on the multi-link robot arm on registry of the multi-link robot arm proximate to or in the predetermined location, wherein the controller is configured to calculate a positional variance of substrate holding station of the end effector, of the multi-link robot arm, from comparison of the first image with a calibration image of the at least part of the set of one or more indicia on the multi-link robot arm, and from the positional variance determine a motion compensation factor changing the extended position of the multi-link robot arm, wherein each of the at least one imaging sensor effecting capture of the first image is disposed inside the perimeter of the mounting interface.

In accordance with one or more aspects of the present disclosure the mounting interface mounts the drive section to the transport chamber and forms a perimeter that separates an interior of the transport chamber on an outside of the perimeter from an exterior of the transport chamber on the inside of the perimeter.

In accordance with one or more aspects of the present disclosure the at least part of the set of one or more indicia captured in the first image is determinative of the positional variance of the substrate holding station of the end effector.

In accordance with one or more aspects of the present disclosure the positional variance calculated by the controller from the comparison of the first image and calibration image of the at least part of the set of one or more indicia on the multi-link robot arm include a positional variance component in the radial direction and another variance component in a direction angled at a non-zero crossing angle with the radial direction, and the motion compensation factor changes the extended position of the multi-link robot arm in at least one of the radial direction and in the angled direction.

In accordance with one or more aspects of the present disclosure the at least part of the set of one or more indicia on the multi-link robot arm captured in the first image includes the end effector with a substrate thereon, which end effector with substrate being imaged in the first image, and the controller determines a substrate eccentricity with respect to a predetermined substrate hold position of the end effector.

In accordance with one or more aspects of the present disclosure the set of one or more indicia on the multi-link robot arm describes linear and rotational characteristics of a position with respect to a predetermined plane, wherein the controller registers the linear and rotational characteristics of a position based on an image of the set of one or more indicia captured with the imaging system.

In accordance with one or more aspects of the present disclosure the multi-link robot arm extends and retracts relative to a shoulder axis of the multi-link robot arm, the shoulder axis being located on the inside of the perimeter.

In accordance with one or more aspects of the present disclosure each of the at least one imaging sensor is located proximate the shoulder axis with respect to a distal position of a robot arm end effector with the multi-link robot arm extended.

In accordance with one or more aspects of the present disclosure a method comprises:

providing a transport chamber of a substrate transport apparatus, the transport chamber having a substrate transport opening arranged for communication with a substrate station module;

providing a drive section with a mounting flange connected to the transport chamber, and having a motor defining at least one independent drive axis;

providing a multi-link robot arm mounted inside the transport chamber, and having an end effector at a distal end of the multi-link robot arm, configured to support a substrate thereon, the multi-link robot arm being operably connected to the drive section;

generating, with the at least one independent drive axis, at least multi-link robot arm motion in a radial direction extending and retracting the multi-link robot arm and moving the end effector, in the radial direction, from a retracted position to an extended position;

providing a set of one or more indicia on the multi-link robot arm that characterize both linear and rotational characteristics of at least one link of the multi-link robot arm with respect to the radial direction;

imaging, with at least one imaging sensor of an imaging system mounted through the mounting flange in a predetermined location with respect to the transport chamber, at least part of the set of one or more indicia on the multi-link robot arm moving along a path defined by the at least one independent drive axis to or in the predetermined location;

capturing, with a controller communicably connected to the imaging system, a first image of the at least part of the set of one or more indicia on the multi-link robot arm on registry of the multi-link robot arm proximate to or in the predetermined location; and calculating, with the controller, a positional variance of the at least part of the multi-link robot arm from comparison of the first image with a calibration image of the at least part of the set of one or more indicia on the multi-link robot arm, and from the positional variance determining a motion compensation factor changing the extended position of the multi-link robot arm, wherein each of the at least one imaging sensor effecting capture of the first image is disposed inside the perimeter of the mounting flange.

In accordance with one or more aspects of the present disclosure the mounting flange mounts the drive section to the transport chamber and forms a perimeter that separates an interior of the transport chamber on an outside of the perimeter from an exterior of the transport chamber on the inside of the perimeter In accordance with one or more aspects of the present disclosure the at least part of the set of one or more indicia captured in the first image is determinative of the positional variance of the substrate holding station of the end effector.

In accordance with one or more aspects of the present disclosure the method further comprises calculating the positional variance, with the controller, from the comparison of the first image and calibration image of the at least part of the set of one or more indicia on the multi-link robot arm includes comparing a positional variance component in the radial direction and another variance component in a direction angled at a non-zero crossing angle with the radial direction, and the motion compensation factor changes the extended position of the multi-link robot arm in at least one of the radial direction and in the angled direction.

In accordance with one or more aspects of the present disclosure the at least part of the set of one or more indicia on the multi-link robot arm captured in the first image includes the end effector with a substrate thereon, which end effector with substrate being imaged in the first image, the method further comprising determining, with the controller, a substrate eccentricity with respect to a predetermined substrate hold position of the end effector.

In accordance with one or more aspects of the present disclosure the set of one or more indicia on the multi-link robot arm describes linear and rotational characteristics of a position with respect to a predetermined plane, the method further comprising registering, with the controller, the linear and rotational characteristics of a position based on an image of the set of one or more indicia captured with the imaging system.

In accordance with one or more aspects of the present disclosure the multi-link robot arm extends and retracts relative to a shoulder axis of the multi-link robot arm, the shoulder axis being located on the inside of the perimeter.

In accordance with one or more aspects of the present disclosure each of the at least one imaging sensor is located proximate the shoulder axis with respect to a distal position of a robot arm end effector with the multi-link robot arm extended.

It should be understood that the foregoing description is only illustrative of the aspects of the present disclosure. Various alternatives and modifications can be devised by those skilled in the art without departing from the aspects of the present disclosure. Accordingly, the aspects of the present disclosure are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the present disclosure.

What is claimed is:

1. A substrate transport apparatus comprising:
    a transport chamber with a substrate transport opening arranged for communication with a substrate station module;
    a drive section with a mounting interface connected to the transport chamber, and having a motor defining at least one independent drive axis, the mounting interface mounting the drive section to the transport chamber and forming a perimeter that separates an interior of the transport chamber on an outside of the perimeter from an exterior of the transport chamber on the inside of the perimeter;
    a robot arm mounted inside the transport chamber, and having an end effector at a distal end of the robot arm, configured to support a substrate thereon, the robot arm being operably connected to the drive section generating, with the at least one independent drive axis, at least arm motion in a radial direction extending and retracting the robot arm and moving the end effector, in the radial direction, from a retracted position to an extended position;
    an imaging system with a camera mounted through the mounting interface in a predetermined location with respect to the transport chamber and disposed so as to image at least part of the robot arm; and
    a controller communicably connected to the imaging system and configured to image, with the camera, the at least part of the robot arm moving along a path defined by the at least one independent drive axis to or in the predetermined location, the controller effecting capture of a first image of the at least part of the robot arm on registry of the robot arm proximate to or in the predetermined location, wherein the controller is configured to calculate a positional variance of the at least part of the robot arm from comparison of the first image with a calibration image of the at least part of the robot arm, and from the positional variance determine a motion compensation factor changing the extended position of the robot arm, wherein each camera effecting capture of the first image is disposed inside the perimeter of the mounting interface.

2. The substrate transport apparatus of claim 1, wherein the positional variance calculated by the controller from the comparison of the first image and calibration image of the at least part of the robot arm include a positional variance component in the radial direction and another variance component in a direction angled at a non-zero crossing angle with the radial direction, and the motion compensation factor changes the extended position of the robot arm in at least one of the radial direction and in the angled direction.

3. The substrate transport apparatus of claim 1, wherein the at least part of the robot arm captured in the first image includes the end effector with a substrate thereon, which end effector with substrate being imaged in the first image, and the controller determines a substrate eccentricity with respect to a predetermined substrate hold position of the end effector.

4. The substrate transport apparatus of claim 1, wherein at least one link of the robot arm has a feature that describes linear and rotational characteristics of a position with respect to a predetermined plane, wherein the controller registers the linear and rotational characteristics of a position based on an image of the feature captured with the imaging system.

5. The substrate transport apparatus of claim 1, wherein the robot arm extends and retracts relative to a shoulder axis of the robot arm, the shoulder axis being located on the inside of the perimeter.

6. The substrate transport apparatus of claim 5, wherein each camera is located proximate the shoulder axis with respect to a distal position of a robot arm end effector with the robot arm extended.

7. A method comprising:
providing a transport chamber of a substrate transport apparatus, the transport chamber having a substrate transport opening arranged for communication with a substrate station module;
providing a drive section with a mounting flange connected to the transport chamber, and having a motor defining at least one independent drive axis, the mounting flange mounting the drive section to the transport chamber and forming a perimeter that separates an interior of the transport chamber on an outside of the perimeter from an exterior of the transport chamber on the inside of the perimeter;
providing a robot arm mounted inside the transport chamber, and having an end effector at a distal end of the robot arm, configured to support a substrate thereon, the robot arm being operably connected to the drive section;
generating, with the at least one independent drive axis, at least robot arm motion in a radial direction extending and retracting the robot arm and moving the end effector, in the radial direction, from a retracted position to an extended position;
imaging, with a camera of an imaging system mounted through the mounting flange in a predetermined location with respect to the transport chamber, at least part of the robot arm moving along a path defined by the at least one independent drive axis to or in the predetermined location;
capturing, with a controller communicably connected to the imaging system, a first image of the at least part of the robot arm on registry of the robot arm proximate to or in the predetermined location; and
calculating, with the controller, a positional variance of the at least part of the robot arm from comparison of the first image with a calibration image of the at least part of the robot arm, and from the positional variance determining a motion compensation factor changing the extended position of the robot arm, wherein each camera effecting capture of the first image is disposed inside the perimeter of the mounting flange.

8. The method of claim 7, further comprising calculating the positional variance, with the controller, from the comparison of the first image and calibration image of the at least part of the robot arm includes comparing a positional variance component in the radial direction and another variance component in a direction angled at a non-zero crossing angle with the radial direction, and the motion compensation factor changes the extended position of the robot arm in at least one of the radial direction and in the angled direction.

9. The method of claim 7, wherein the at least part of the robot arm captured in the first image includes the end effector with a substrate thereon, which end effector with substrate being imaged in the first image, the method further comprising determining, with the controller, a substrate eccentricity with respect to a predetermined substrate hold position of the end effector.

10. The method of claim 7, wherein at least one link of the robot arm has a feature that describes linear and rotational characteristics of a position with respect to a predetermined plane, the method further comprising registering, with the controller, the linear and rotational characteristics of a position based on an image of the feature captured with the imaging system.

11. The method of claim 7, wherein the robot arm extends and retracts relative to a shoulder axis of the robot arm, the shoulder axis being located on the inside of the perimeter.

12. The method of claim 11, wherein each camera is located proximate the shoulder axis with respect to a distal position of a robot arm end effector with the robot arm extended.

13. A substrate transport apparatus comprising:
a transport chamber with a substrate transport opening arranged for communication with a substrate station module;
a drive section with a mounting interface connected to the transport chamber, and having a motor defining at least one independent drive axis;
a multi-link robot arm mounted inside the transport chamber, and having an end effector at a distal end of the multi-link robot arm, configured to support a substrate thereon, the multi-link robot arm being operably connected to the drive section generating, with the at least one independent drive axis, at least arm motion in a radial direction extending and retracting the multi-link robot arm and moving the end effector, in the radial direction, from a retracted position to an extended position;
a set of one or more indicia on the multi-link robot arm that characterize both linear and rotational characteristics of at least one link of the multi-link robot arm with respect to the radial direction;

an imaging system with at least one imaging sensor mounted through the mounting interface in a predetermined location with respect to the transport chamber and disposed so as to image at least part of the set of one or more indicia on the multi-link robot arm; and a controller communicably connected to the imaging system and configured to image, with the at least one imaging sensor, the at least part of the set of one or more indicia on the multi-link robot arm moving along a path defined by the at least one independent drive axis to or in the predetermined location, the controller effecting capture of a first image of the at least part of the set of one or more indicia on the multi-link robot arm on registry of the multi-link robot arm proximate to or in the predetermined location, wherein the controller is configured to calculate a positional variance of substrate holding station of the end effector, of the multi-link robot arm, from comparison of the first image with a calibration image of the at least part of the set of one or more indicia on the multi-link robot arm, and from the positional variance determine a motion compensation factor changing the extended position of the multi-link robot arm, wherein each of the at least one imaging sensor effecting capture of the first image is disposed inside the perimeter of the mounting interface.

14. The substrate transport apparatus of claim 13, wherein the mounting interface mounts the drive section to the transport chamber and forms a perimeter that separates an interior of the transport chamber on an outside of the perimeter from an exterior of the transport chamber on the inside of the perimeter.

15. The substrate transport apparatus of claim 13, wherein the at least part of the set of one or more indicia captured in the first image is determinative of the positional variance of the substrate holding station of the end effector.

16. The substrate transport apparatus of claim 13, wherein the positional variance calculated by the controller from the comparison of the first image and calibration image of the at least part of the set of one or more indicia on the multi-link robot arm include a positional variance component in the radial direction and another variance component in a direction angled at a non-zero crossing angle with the radial direction, and the motion compensation factor changes the extended position of the multi-link robot arm in at least one of the radial direction and in the angled direction.

17. The substrate transport apparatus of claim 13, wherein the at least part of the set of one or more indicia on the multi-link robot arm captured in the first image includes the end effector with a substrate thereon, which end effector with substrate being imaged in the first image, and the controller determines a substrate eccentricity with respect to a predetermined substrate hold position of the end effector.

18. The substrate transport apparatus of claim 13, wherein the set of one or more indicia on the multi-link robot arm describes linear and rotational characteristics of a position with respect to a predetermined plane, wherein the controller registers the linear and rotational characteristics of a position based on an image of the set of one or more indicia captured with the imaging system.

19. The substrate transport apparatus of claim 13, wherein the multi-link robot arm extends and retracts relative to a shoulder axis of the multi-link robot arm, the shoulder axis being located on the inside of the perimeter.

20. The substrate transport apparatus of claim 19, wherein each of the at least one imaging sensor is located proximate the shoulder axis with respect to a distal position of a robot arm end effector with the multi-link robot arm extended.

21. A method comprising:
providing a transport chamber of a substrate transport apparatus, the transport chamber having a substrate transport opening arranged for communication with a substrate station module;

providing a drive section with a mounting flange connected to the transport chamber, and having a motor defining at least one independent drive axis;

providing a multi-link robot arm mounted inside the transport chamber, and having an end effector at a distal end of the multi-link robot arm, configured to support a substrate thereon, the multi-link robot arm being operably connected to the drive section;

generating, with the at least one independent drive axis, at least multi-link robot arm motion in a radial direction extending and retracting the multi-link robot arm and moving the end effector, in the radial direction, from a retracted position to an extended position;

providing a set of one or more indicia on the multi-link robot arm that characterize both linear and rotational characteristics of at least one link of the multi-link robot arm with respect to the radial direction;

imaging, with at least one imaging sensor of an imaging system mounted through the mounting flange in a predetermined location with respect to the transport chamber, at least part of the set of one or more indicia on the multi-link robot arm moving along a path defined by the at least one independent drive axis to or in the predetermined location;

capturing, with a controller communicably connected to the imaging system, a first image of the at least part of the set of one or more indicia on the multi-link robot arm on registry of the multi-link robot arm proximate to or in the predetermined location; and calculating, with the controller, a positional variance of the at least part of the multi-link robot arm from comparison of the first image with a calibration image of the at least part of the set of one or more indicia on the multi-link robot arm, and from the positional variance determining a motion compensation factor changing the extended position of the multi-link robot arm, wherein each of the at least one imaging sensor effecting capture of the first image is disposed inside the perimeter of the mounting flange.

22. The method of claim 21, wherein the mounting flange mounts the drive section to the transport chamber and forms a perimeter that separates an interior of the transport chamber on an outside of the perimeter from an exterior of the transport chamber on the inside of the perimeter.

23. The method of claim 21, wherein the at least part of the set of one or more indicia captured in the first image is determinative of the positional variance of the substrate holding station of the end effector.

24. The method of claim 21, further comprising calculating the positional variance, with the controller, from the comparison of the first image and calibration image of the at least part of the set of one or more indicia on the multi-link robot arm includes comparing a positional variance component in the radial direction and another variance component in a direction angled at a non-zero crossing angle with the radial direction, and the motion compensation factor changes the extended position of the multi-link robot arm in at least one of the radial direction and in the angled direction.

25. The method of claim 21, wherein the at least part of the set of one or more indicia on the multi-link robot arm captured in the first image includes the end effector with a substrate thereon, which end effector with substrate being imaged in the first image, the method further comprising determining, with the controller, a substrate eccentricity with respect to a predetermined substrate hold position of the end effector.

26. The method of claim 21, wherein the set of one or more indicia on the multi-link robot arm describes linear and rotational characteristics of a position with respect to a predetermined plane, the method further comprising registering, with the controller, the linear and rotational characteristics of a position based on an image of the set of one or more indicia captured with the imaging system.

27. The method of claim 21, wherein the multi-link robot arm extends and retracts relative to a shoulder axis of the multi-link robot arm, the shoulder axis being located on the inside of the perimeter.

28. The method of claim 27, wherein each of the at least one imaging sensor is located proximate the shoulder axis with respect to a distal position of a robot arm end effector with the multi-link robot arm extended.

\* \* \* \* \*